(12) United States Patent
Disney et al.

(10) Patent No.: US 7,759,731 B2
(45) Date of Patent: Jul. 20, 2010

(54) LATERAL TRENCH MOSFET WITH DIRECT TRENCH POLYSILICON CONTACT AND METHOD OF FORMING THE SAME

(75) Inventors: Donald Ray Disney, Cupertino, CA (US); Cho Chiu Ma, Hong Kong (CN)

(73) Assignees: Advanced Analogic Technologies, Inc., Santa Clara, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 676 days.

(21) Appl. No.: 11/511,056

(22) Filed: Aug. 28, 2006

(65) Prior Publication Data

US 2008/0048251 A1    Feb. 28, 2008

(51) Int. Cl.
*H01L 29/78* (2006.01)
(52) U.S. Cl. ............... 257/334; 438/270; 257/E27.015
(58) Field of Classification Search ............ 257/334, 257/E27.015; 438/270
See application file for complete search history.

(56) References Cited

U.S. PATENT DOCUMENTS

| 5,877,528 | A | 3/1999 | So | 257/341 |
|---|---|---|---|---|
| 6,031,265 | A | 2/2000 | Hshieh | 257/334 |
| 6,717,210 | B2 | 4/2004 | Takano et al. | 257/330 |
| 6,838,722 | B2 | 1/2005 | Bhalla et al. | 257/301 |
| 7,009,247 | B2 | 3/2006 | Darwish | 257/330 |
| 2002/0187597 | A1 | 12/2002 | Ninomiya | 438/197 |
| 2003/0080379 | A1 | 5/2003 | Oikawa et al. | 257/331 |
| 2004/0058481 | A1 | 3/2004 | Xu et al. | 438/135 |
| 2004/0173844 | A1 | 9/2004 | Williams et al. | 257/329 |

FOREIGN PATENT DOCUMENTS

| JP | 2000-138353 A | 5/2000 |
|---|---|---|
| WO | WO 2006/048689 | 5/2006 |

OTHER PUBLICATIONS

Patent Abstracts of Japan, Pub. No. 2000-138353, Toshiba Corp., May 5, 2000.

*Primary Examiner*—W. David Coleman
*Assistant Examiner*—Sonya D McCall-Shepard
(74) *Attorney, Agent, or Firm*—Patentability Associates

(57) ABSTRACT

A lateral trench MOSFET includes a trench containing a device segment and a gate bus segment. The gate bus segment of the trench is contacted by a conductive plug formed in a dielectric layer overlying the substrate, thereby avoiding the need for the conventional surface polysilicon bridge layer. The conductive plug is formed in a substantially vertical hole in the dielectric layer. The gate bus segment may be wider than the device segment of the trench. A method includes forming a shallow trench isolation (STI) while the conductive material in the trench is etched.

22 Claims, 21 Drawing Sheets

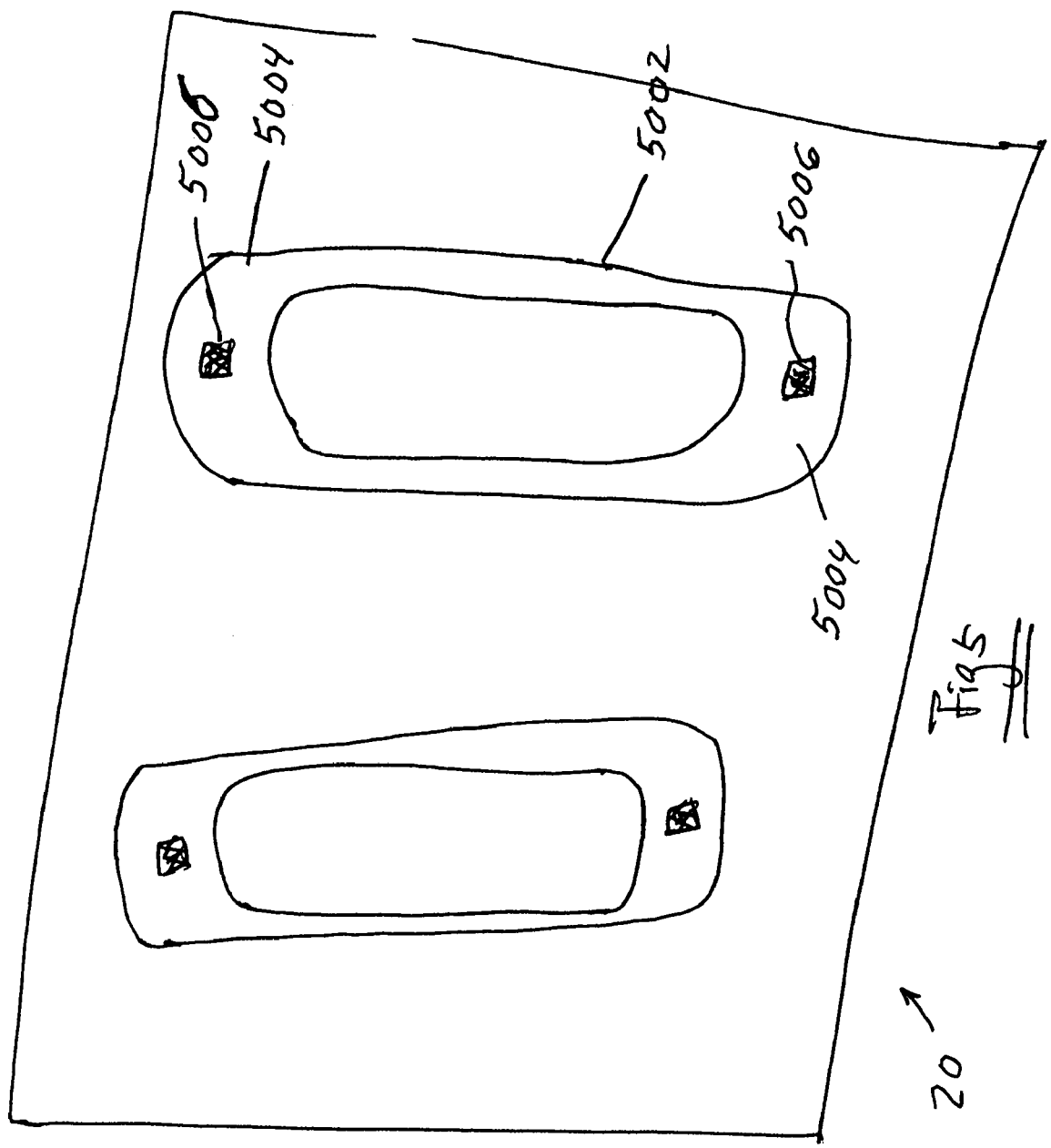

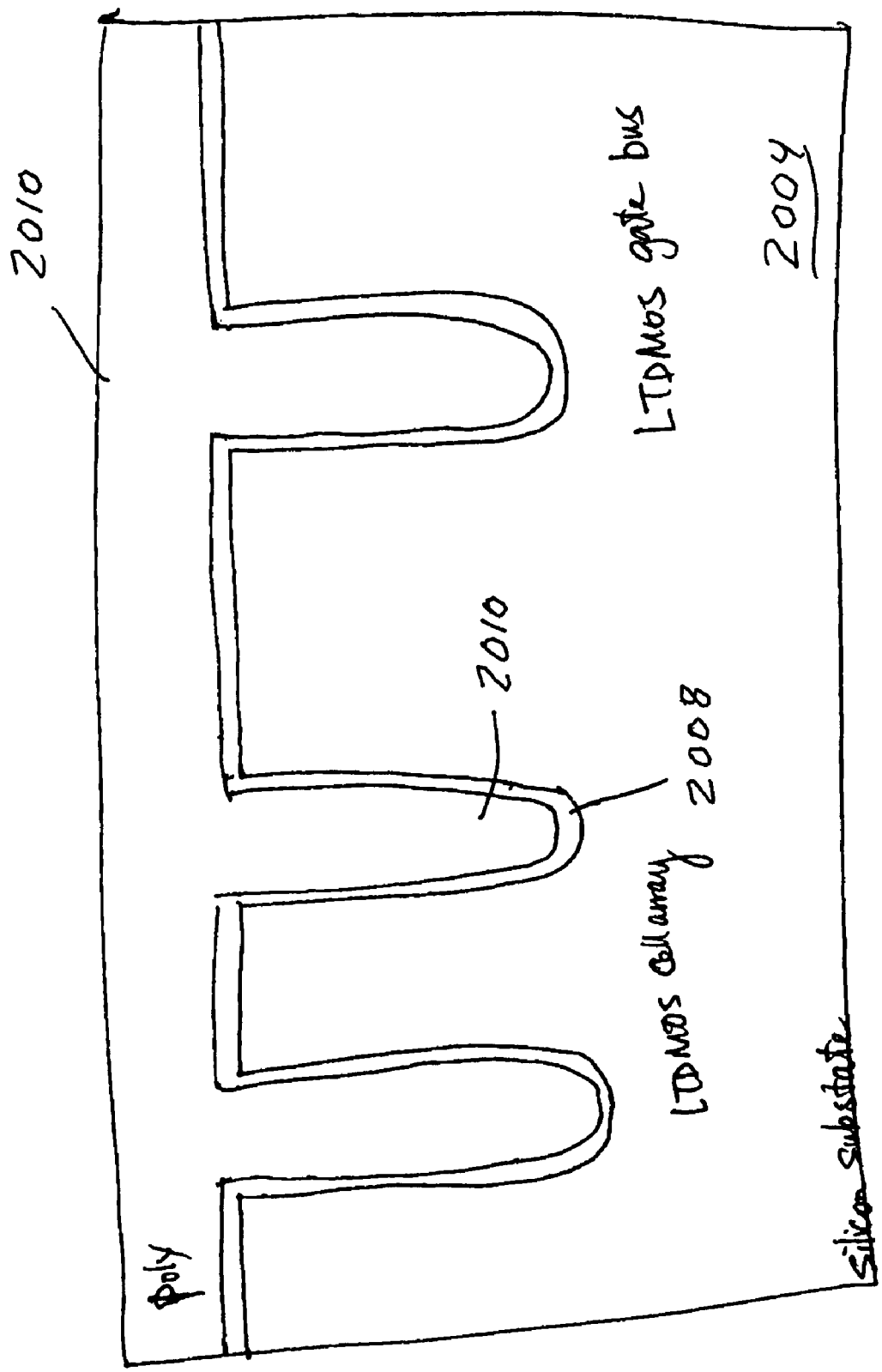

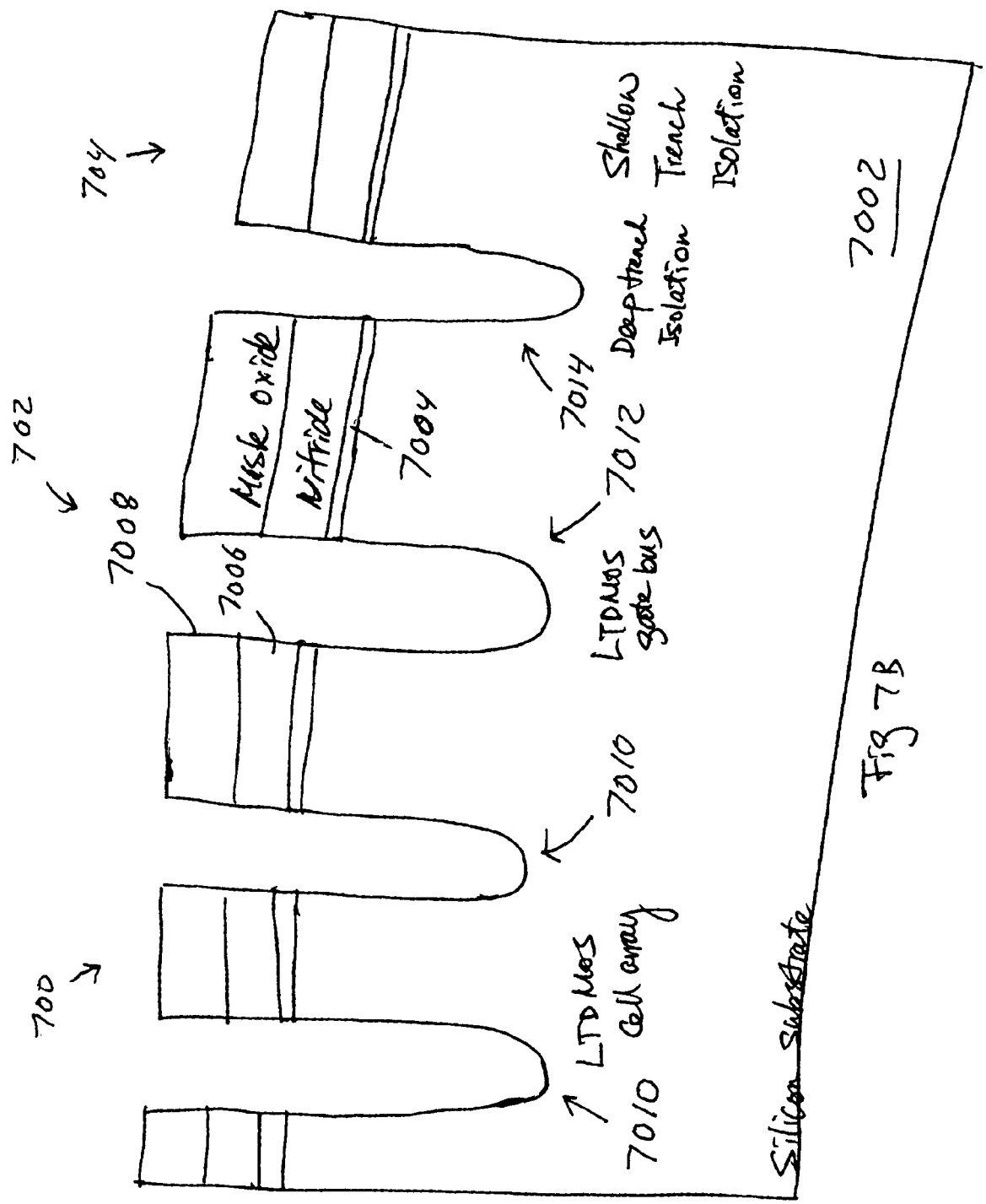

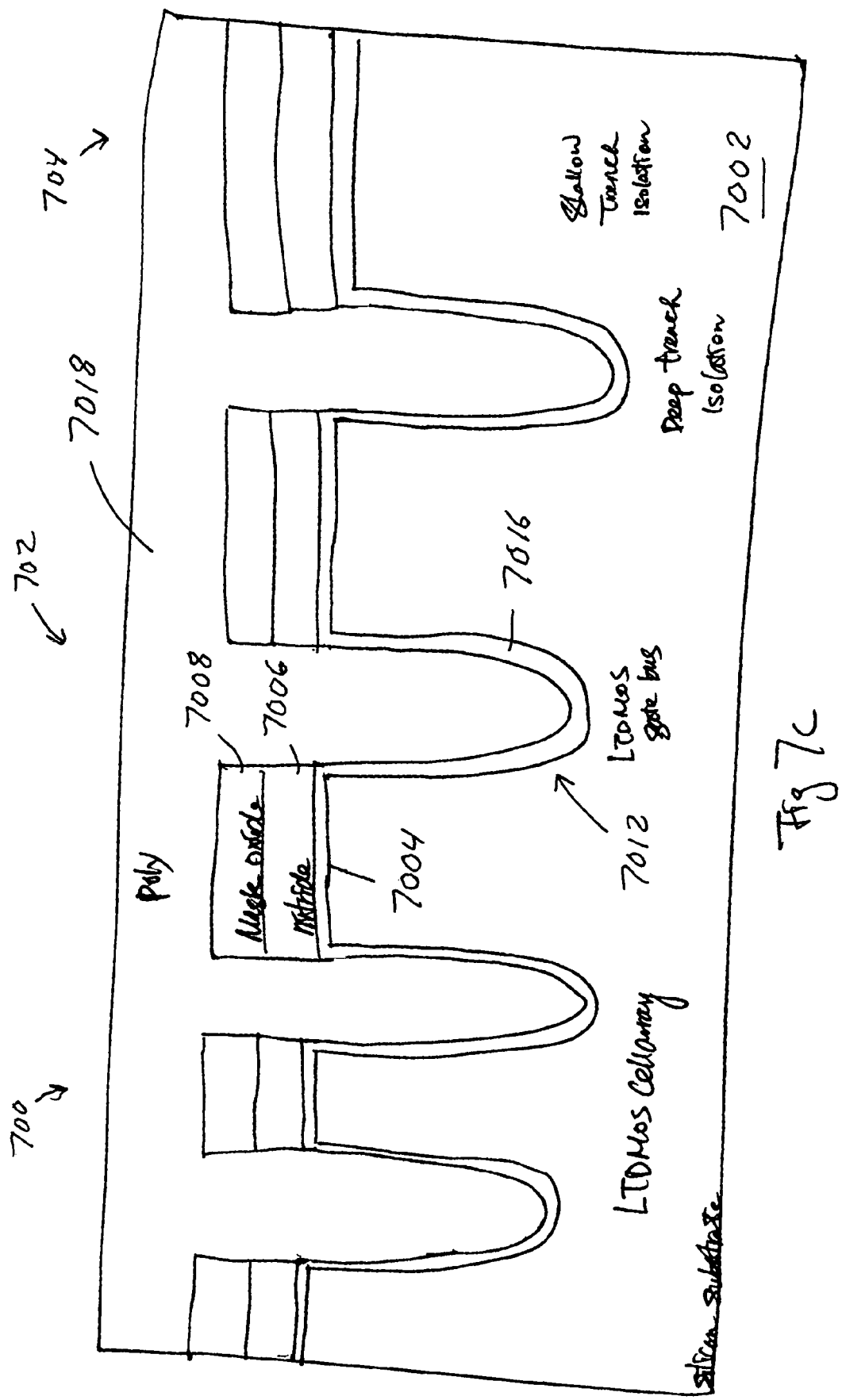

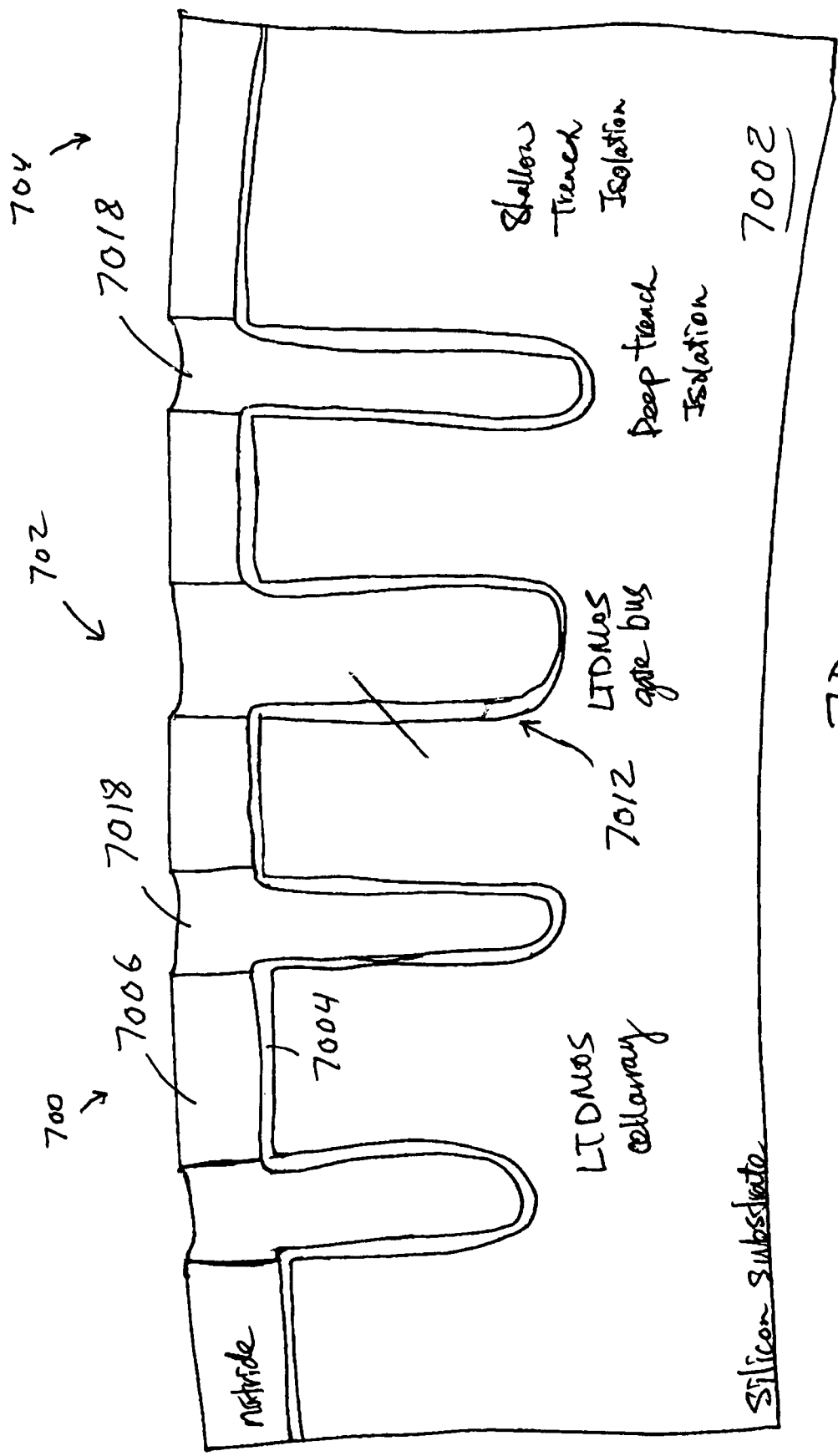

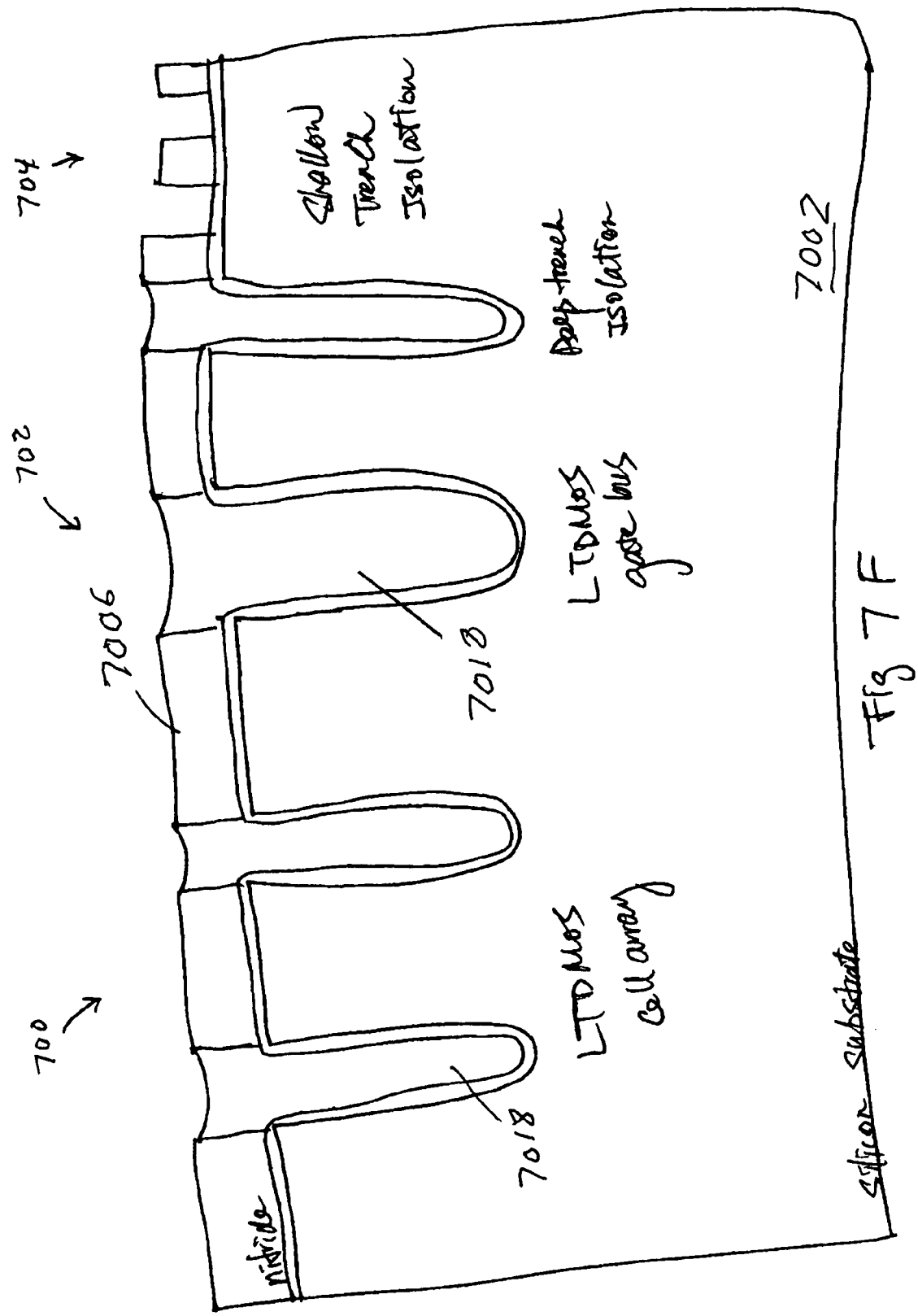

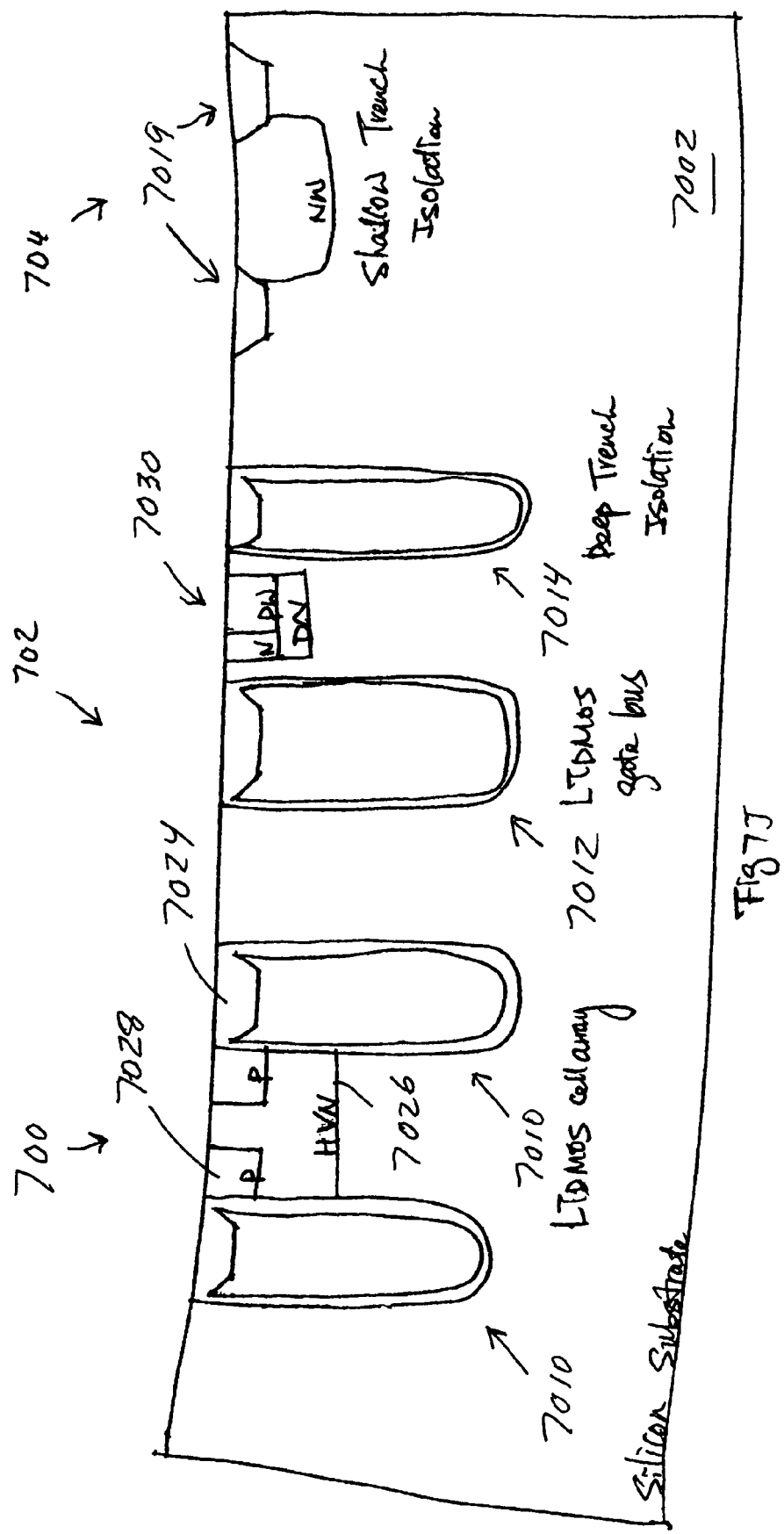

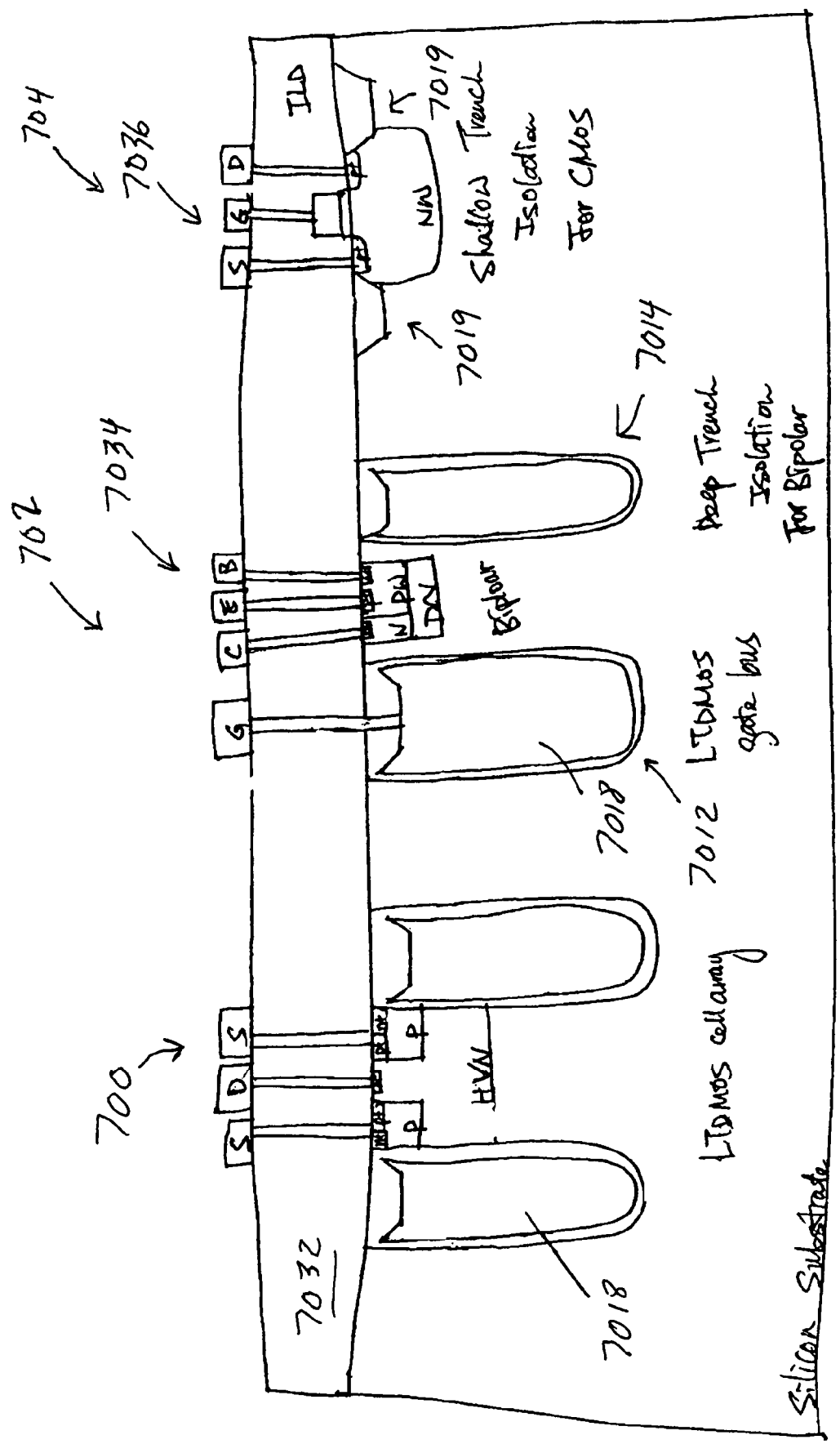

LATERAL TRENCH MOSFET WITH DIRECT TRENCH POLYSILICON CONTACT AND METHOD OF FORMING THE SAME

FIELD OF THE INVENTION

This invention relates to power semiconductor devices and in particular to lateral trench MOSFETs.

BACKGROUND OF THE INVENTION

Lateral Trench MOSFET (LTDMOS) devices are power semiconductor devices that may be integrated with control circuitry to form monolithic power integrated circuits (ICs) used in a wide range of applications, including power management ICs. LTDMOS devices consist of large trench areas that are oxidized and filled with polysilicon ("poly"). The poly forms the gate electrode of the LTDMOS, the oxide layer forms the gate oxide, and channel regions are formed on the sidewalls of the silicon trenches. Current generally flows vertically through the channel regions, then laterally through a drift region.

To maximize the density of the LTDMOS channel regions, it is important to minimize the width of the trenches. As a result, the trench poly is generally not wide enough to allow contact by the metallization layer or contact plugs. Prior art LTDMOS devices employ sections of poly that are deposited on the surface of the silicon (above the top of the trench poly) to provide a bridge between the trench poly and the metallization layer. One prior approach is to mask these bridge regions during the poly recess etch, such that they remain on the surface and can be used for contact regions. If the same oxide layer that forms the trench gate oxide is used to isolate these bridge regions from the substrate, the oxide under the bridge regions is quite thin and limits the yield and reliability of the device. Another prior approach relies on an additional poly layer deposited above the trench poly in the bridge areas. This approach generally provides a thicker oxide layer under the poly bridge for improved reliability, but it requires more process complexity and may reduce the product yield due to the process margin requirements introduced by the additional process steps.

Moreover, the use of a surface poly bridge layer degrades the overall planarity of the device and makes monolithic integration of other devices more difficult.

Therefore, it is a goal of this invention to provide improved LTDMOS device designs and methods of manufacturing that have simplified processing, greater planarity, and reduced weak oxide areas compared to the prior art.

SUMMARY OF THE INVENTION

In an LTDMOS device according to this invention, a gate trench is formed in a semiconductor substrate, the gate trench being lined with a gate dielectric layer and filled with a conductive material. A body region of a first conductivity type is positioned along a sidewall of the gate trench. A source region of a second conductivity type is positioned at a surface of the substrate adjacent the body region, and a drift region of the second conductivity type is positioned along the sidewall of the gate trench adjacent the body region. A drain contact region of the second conductivity type is positioned at the surface of the substrate adjacent the drift region and laterally spaced from the gate trench.

A gate bus trench is formed in the substrate, the gate bus trench containing a conductive material that is in electrical contact with the conductive material in the gate trench.

A interlevel dielectric layer is formed over the surface of the substrate. A gate contact hole is formed in the interlevel dielectric layer over the gate bus trench, and a conductive gate contact plug is positioned in the gate contact hole. The gate contact plug is in contact with the conductive material in the gate bus trench and with a gate metallization layer at a top surface of the interlevel dielectric layer.

The invention includes a process of fabricating the LTDMOS device. The gate and gate bus trenches are etched in the substrate, lined with the gate dielectric layer and filled with the conductive material. The source, body, drift and drain contact regions are formed in the substrate. The interlevel dielectric layer is deposited on the surface of the substrate and the gate contact hole is formed in the interlevel dielectric layer. The gate contact hole is filled with the gate contact plug, and the gate metallization layer is formed on the top surface of the interlevel dielectric layer.

A deep isolation trench may be formed during the same process step that is used to form the gate and gate bus trenches.

In an alternative embodiment, the top surface of the conductive material in the gate bus trench is recessed with respect to the surface of the substrate, and the region above the conductive material in the gate bus trench is filled with a second dielectric layer. Optionally, the recess may be formed during the same process step that is used to form a shallow isolation trench in the substrate, and the same dielectric material may be used to fill the shallow isolation trench and the recess in the gate bus trench. Thereafter, the top surface of the second dielectric layer may be planarized, and a interlevel dielectric layer may be deposited on the substrate.

The implants used to form the source, body, drift and drain contact regions may be used to form the component of other devices in the substrate. For example, these implants may be used to form the collector, base and emitter of a bipolar transistor, which may be isolated by the gate bus and/or the deep isolation trenches.

BRIEF DESCRIPTION OF THE DRAWINGS

FIG. 5 is a top view of an LTDMOS with a direct poly gate contact on pairs of trench gate fingers.

FIGS. 6A-6E illustrate a process for fabricating an LTDMOS in accordance with this invention.

FIG. 6A is a cross-sectional view of the substrate after the etching of the trenches.

FIG. 6B is a cross-sectional view of the device after the growth of the gate oxide and the deposition of the gate poly.

FIG. 6C is a cross-sectional view of the device after the poly recess etch, the formation of the drift region and the body region, and the deposition of the protection layer.

FIG. 6D is a cross-sectional view of the device after the formation of the source and drain regions.

FIG. 6E is a cross-sectional view of the LTDMOS after the formation of the contacts and metallization.

FIGS. 7A-7K illustrate an alternative process for fabricating an LTDMOS in accordance with this invention.

FIG. 7A is a cross-sectional view of the device after the growth of a pad oxide layer and the deposition of a pad nitride layer and an oxide mask layer.

FIG. 7B is a cross-sectional view of the device after the patterning of the mask layer and the etching of the trench.

FIG. 7C is a cross sectional view of the device after the growth of the gate oxide layer and the deposition of the poly.

FIG. 7D is a cross-sectional view of the device after the recess etch of the poly and the removal mask oxide.

FIG. 7E is a cross-sectional view of the device after the formation of a photoresist mask layer and the etching of the nitride layer for the shallow trench isolation (STI) regions.

FIG. 7F is a cross-sectional view of the device after the removal of the photoresist mask layer.

FIG. 7G is a cross-sectional view of the device after the STI etch.

FIG. 7H is a cross-sectional view of the device after the deposition of the shallow trench isolation oxide layer.

FIG. 7I is a cross-sectional view of the device after the STI chemical-mechanical planarization (CMP), the removal of the nitride layer, and the removal of the pad oxide layer.

FIG. 7J is a cross-sectional view of the device after the HVN implant, the P-body implant, the P well implant, and the N well implant.

FIG. 7K is a cross-sectional view of the device after the formation of the interlayer dielectric (ILD), the contact mask and etch, and the metallization.

DESCRIPTION OF THE INVENTION

The LTDMOS devices of the present invention offer several advantages over the state-of-the-art LTDMOS devices. The new LTDMOS devices incorporate contact of the gate metal to the trench gate poly without any surface poly bridge. Since there is no surface poly layer with an underlying oxide layer, there is no degradation of the overall gate oxide integrity. Moreover, by eliminating the surface poly layer altogether, the process is simplified and planarity of the device is enhanced, which makes it easier to integrate other devices on the same substrate with the LTDMOS. Moreover, the formation of the LTDMOS trench gate and gate bus may be completely independent of the processing used to form the other integrated devices, making it much easier to integrate the LTDMOS into a given baseline process and make it modular (the remaining devices do not change characteristics whether the LTDMOS is included or not). Also, the LTDMOS of this invention may be protected during the fabrication of the other integrated devices, so that the trench gate poly and trench gate oxide are not attacked by subsequent processing. In one embodiment of this invention, the trench gate poly regions are recessed using etching steps that may be common with shallow trench isolation (STI) processing. In this embodiment, the LTDMOS gate bus is embedded below the silicon level, providing very good trench gate isolation.

Figure 1:
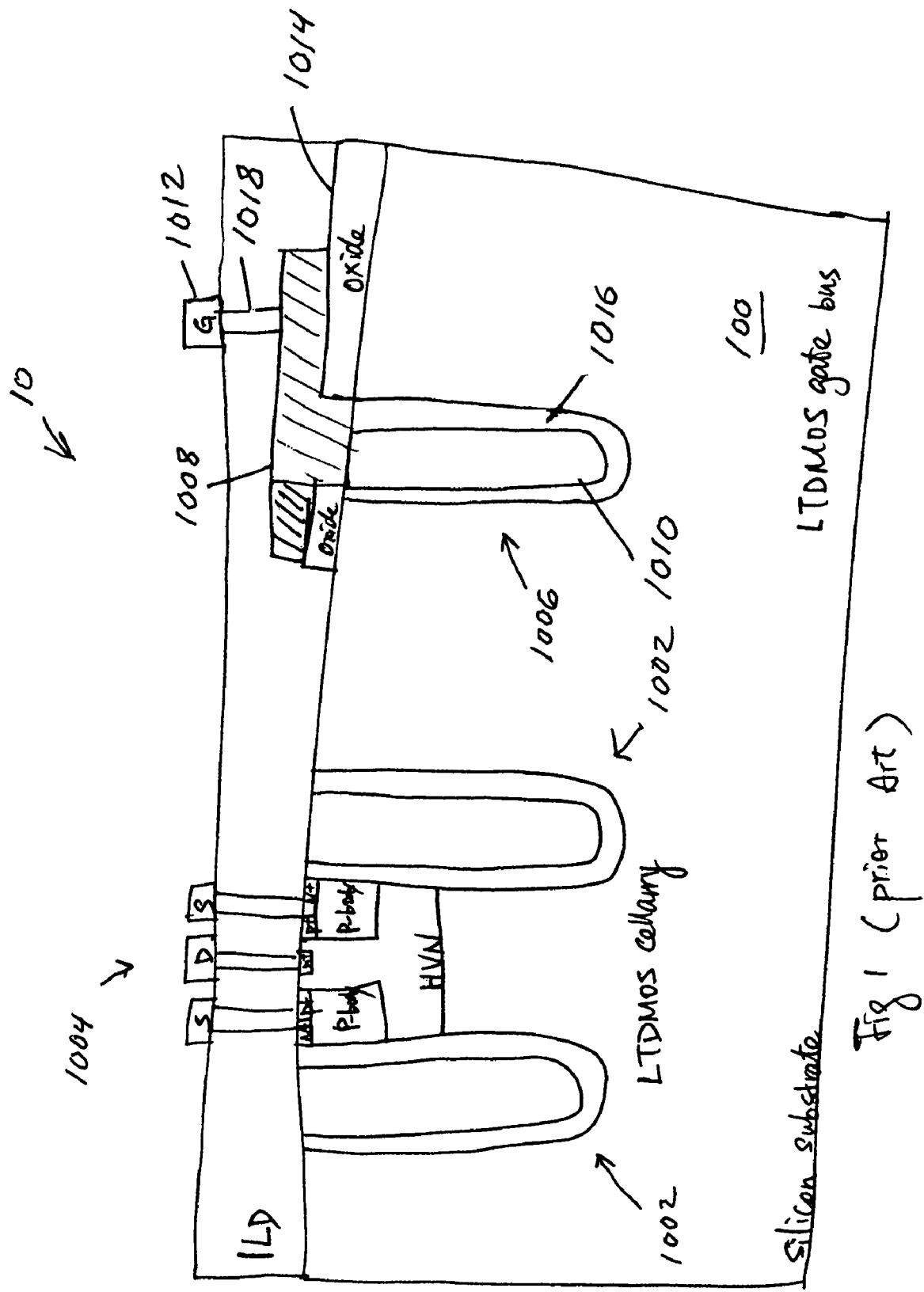
FIG. 1 is a cross-sectional view of a prior art LTDMOS with a poly bridge region under gate contact.
Figure 3:
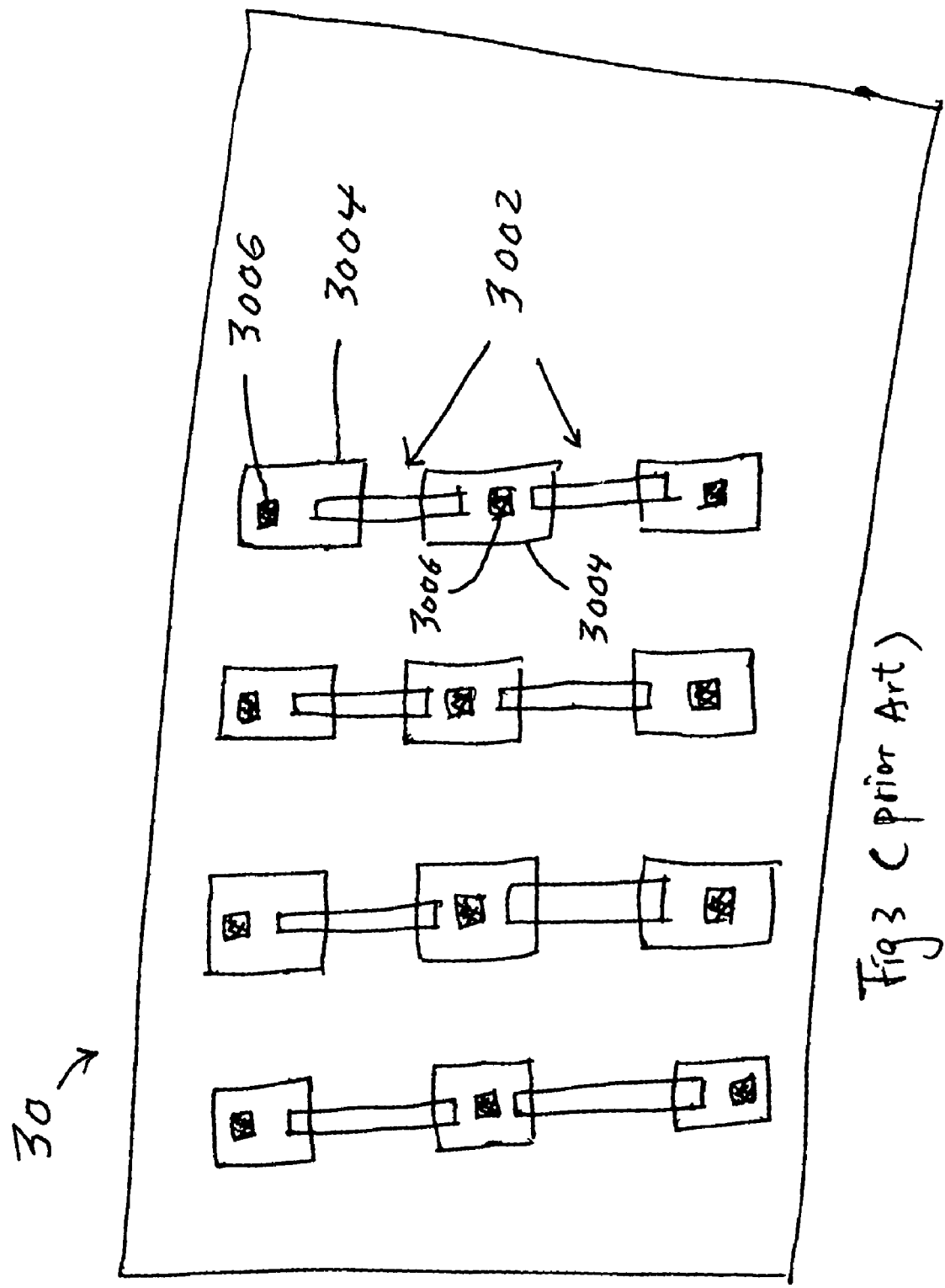
FIG. 3 is a top view of a prior art LTDMOS with poly bridge regions connecting the gate contact to the poly gate.

FIG. 1 shows a schematic cross-section of a prior art LTDMOS 10. The trench gates 1002 in the LTDMOS array (active area) 1004 and trench gate 1006 that provides contact to the gate metallization are the same width, which is normally too narrow to allow direct contact by the gate metallization. Therefore, a surface poly bridge layer 1008 is formed that is in contact with the gate poly 1010 and is large enough to form a contact to the gate metallization layer 1012 through a contact plug 1018. The poly bridge layer 1008 must be isolated from the substrate 100. A thick oxide layer 1014 may be used to do this, as shown in FIG. 1, or the same thin oxide layer 1016 that serves as the trench gate oxide may be used. Although poly bridge layer 1008 and the associated trench gate 1006 are shown in isolation from trench gates 1002, they are actually connected in another plane of this device. For example, a top-view of a prior art LTDMOS 30 is shown in FIG. 3. In this layout, each elongated trench gate 3002 is contacted at each end and in the middle by a poly bridge layer 3004 and a contact plug 3006. Poly bridge layer 3004 is substantially wider than the trench gates 3002, to allow for contact by the contact plugs 3006.

Figure 2:
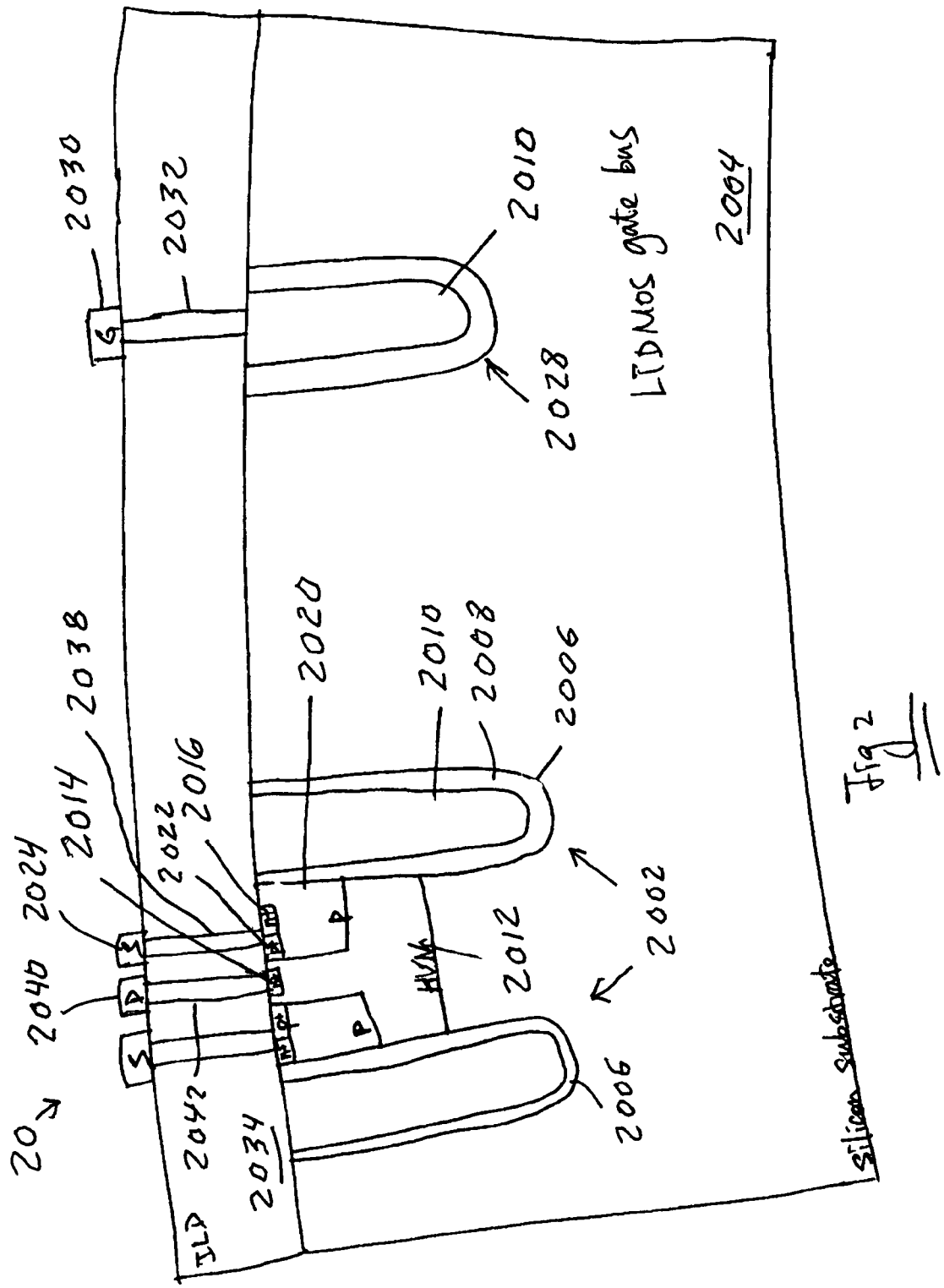
FIG. 2 is a cross-sectional view of an LTDMOS with a direct poly gate contact via a contact plug.

FIG. 2 shows a cross-sectional view of an LTDMOS device 20 in accordance with this invention. For the sake of clarity, the LTDMOS array area of FIG. 2 shows only two trench gates 2002, and some device details (such as multiple levels of metallization) are not shown. The trench gates 2002 are formed by a recess etch into a P-type substrate 2004. The LTDMOS trenches 2006 are lined with a gate dielectric layer 2008, such as silicon dioxide, and filled with a conductive gate material 2010, for example doped polysilicon. An N-type drift region 2012 is formed to laterally connect LTDMOS trenches 2006 with a drain contact region 2014. A source contact region 2016 is located adjacent each of trench gates 2002 and separated from the drift region 2012 by a P-body region 2020. A body contact region 2022 is shown adjacent each of the source contact regions 2016, and body contact regions 2022 and source contact regions 2016 are connected to a source metallization layer 2024. In other embodiments, however, the source contact regions 2016 and body contact regions 2022 could be separated and connected to different electrodes.

Overlying substrate 2004 is an interlevel dielectric (ILD) layer 2034. Source metallization layer 2024 contacts source contact regions 2016 and body contact regions 2022 via source contact plugs 2038 that are positioned within holes in ILD layer 2034. Similarly, a drain metallization layer 2040 contacts drain contact region 2014 via a drain contact plug 2042 that is positioned within a hole in ILD layer 2034.

When the LTDMOS 20 operates in the off-state (current blocking), there is no channel along the sidewall of trench gate 2002, and high voltage can be supported by mutual depletion of the drift region 2012, body region 2020, and substrate 2004. In the on-state, a voltage is applied to the trench gate 2002 to cause a channel to form in the body region 2020 along the sidewall of trench gate 2002, providing a path for current to flow from the source contact region 2016, vertically through the channel, laterally through the drift region 2012, to drain contact region 2014. By way of example, LTDMOS 20 could have a breakdown voltage (BV) of about 30V implemented in a process with 0.35 µm design rules. In this example, the main trench gate width might be about 0.5 µm, which is too narrow to allow contact by the gate metallization layer. The spacing between adjacent main trench gate fingers is determined by the drift region required to support the required for a given LTDMOS, and could be about 5 µm.

A gate bus trench 2028 formed in the gate bus portion of the LTDMOS 20 is wider than the trench gates 2002 in the LTDMOS array area. Gate bus trench 2028 is preferably wide enough to allow direct contact by the gate metallization layer 2030. In the embodiment shown here, this contact is made via a gate contact plug 2032, which is formed by a conductive material such as tungsten. The width of the gate bus trench 2028 is preferably the minimum required to allow for reliable and reproducible contact formation, as wider trenches may complicate the deposition and etch-back of the trench poly. In this example, the contact plug 2032 is about 0.4 µm wide, and the gate bus trench 2028 is about 1.0 µm wide.

Figure 4:
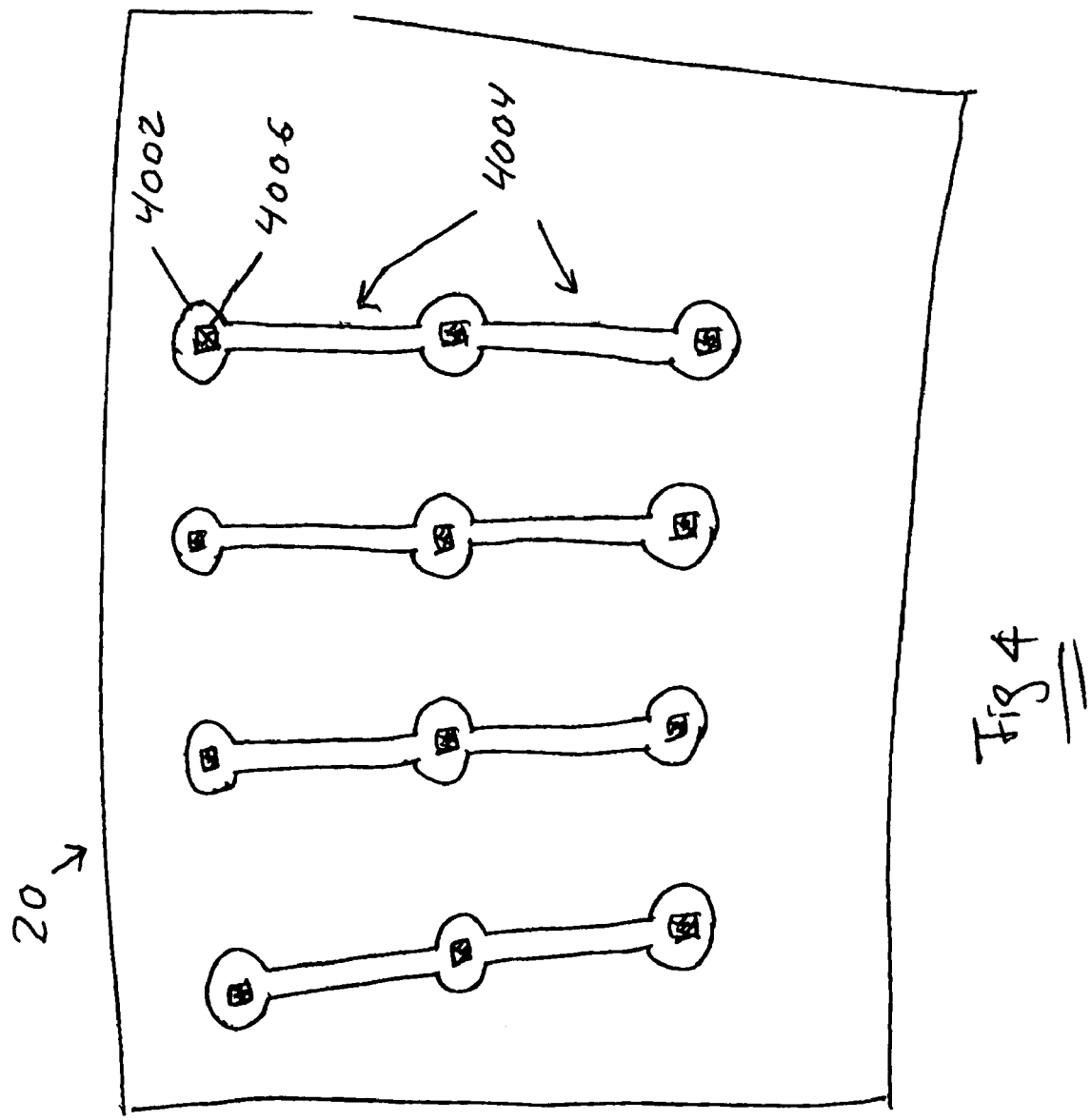
FIG. 4 is a top view of an LTDMOS with a direct poly gate contact on each trench gate finger.

A top view of one embodiment of LTDMOS device 20 containing a series of linear trenches is shown in FIG. 4. One or more contact areas 4002 are formed in some areas of the LTDMOS gate structure, preferably near each end of each elongated trench gate finger 4004 and occasionally along the length of each trench gate finger 4004. The trench width in the contact area 4002 is large enough to allow indirect contact by the gate metallization layer via a contact plug 4006. For the LTDMOS 20, the spacing between gate fingers 4004 is wide enough to allow enlargement of each gate finger 4004 to form a corresponding contact area 4002.

FIG. 5 shows a top view of an alternate embodiment of LTDMOS 20, in which the main trench fingers 5002 are joined in closed loops with widened contact areas 5004. Electrical contact between contact areas 5004 and gate electrodes (not shown) is made via contact plugs 5006. One of ordinary skill in the art will appreciate that there are many other potential LTDMOS layouts that provide the benefit of the direct trench contact and are thus within the scope of this invention.

Figure 6A:
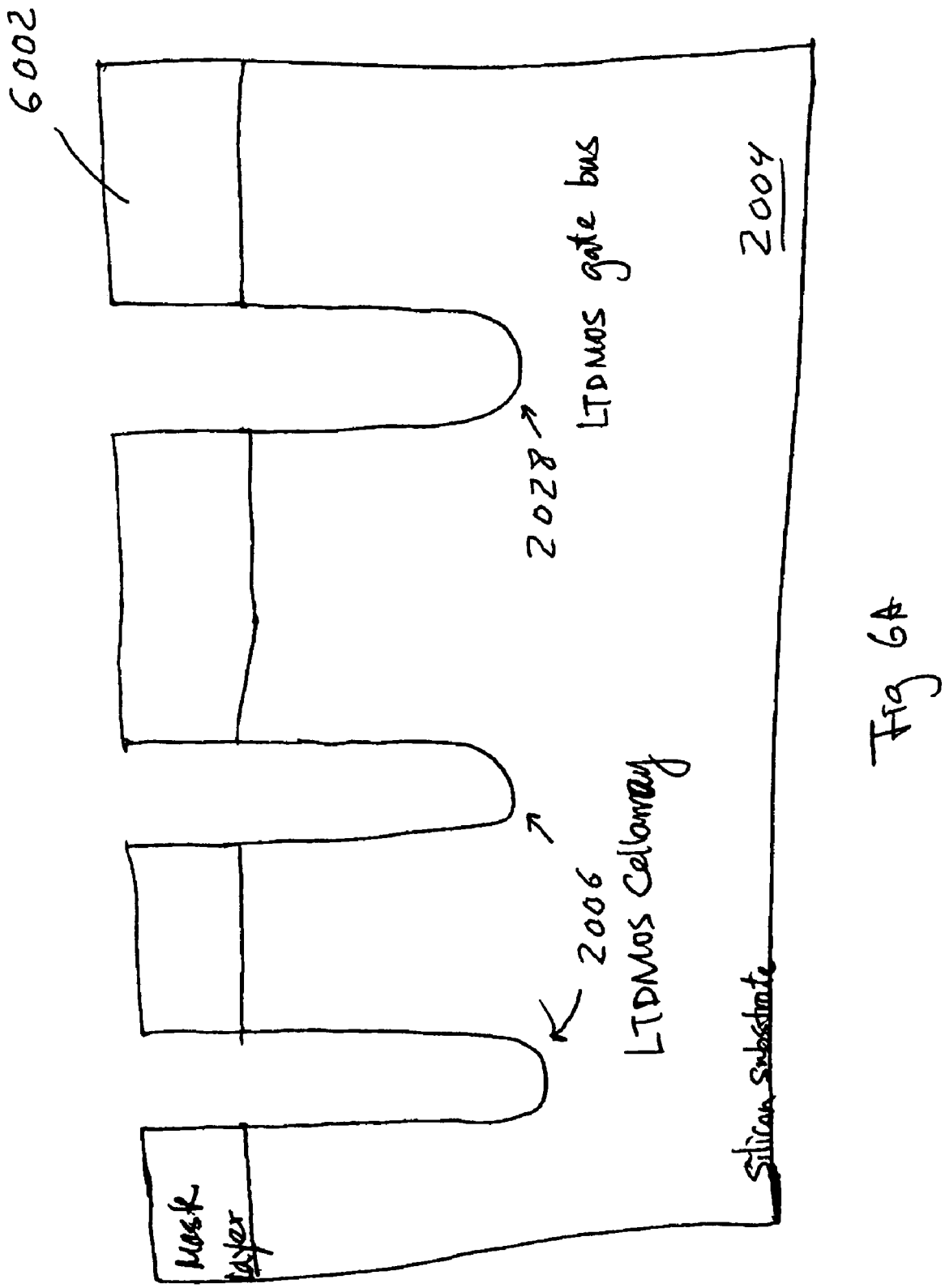

FIGS. 6A-6E show cross-sectional views after key steps in a preferred manufacturing method for the LTDMOS 20. FIG. 6A shows the device after masking and etching to form the LTDMOS trenches 2006 and a gate bus trench 2028 in the silicon substrate 2004. The mask material 6002 is preferably an oxide hard mask, but could also comprise photoresist or other suitable materials. The depth of trenches 2006 and 2028 is determined by requirements of the LTDMOS device. In this example, the trench depth is about 1.5 µm. The width of LTDMOS trenches 2006 is preferably the minimum allowed by the process, in order to increase the trench density for better on-state performance, while the spacing between LTDMOS trenches 2006 is governed primarily by the off-state (BV) requirements of the device. In this example, the width of LTDMOS trenches 2006 is about 0.5 µm and the spacing between trenches LTDMOS 2006 is about 5 µm. The gate bus trench 2028 is substantially wider than the LTDMOS trenches 2006 in the LTDMOS cell array. The width of gate bus trench 2028 is preferably the minimum width required for contact by the standard contact plug employed in the process. In this example, the width of gate bus trench 2028 is about 1 µm.

FIG. 6B shows the LTDMOS device 20 after formation of gate dielectric layer 2008 and conductive gate layer material 2010. The gate dielectric layer 2008 in this example is thermally grown silicon dioxide, but other suitable gate materials may also be used. The thickness of the gate dielectric layer 2008 is chosen to support the required gate voltage and provide the desired threshold voltage. In this example, gate dielectric layer 2008 has a thickness of about 200 Å. The conductive gate material 2010 in this example is in-situ doped polysilicon, but other suitable gate materials may also be used. The polysilicon in this example is heavily doped to provide low resistance in the conductive gate material 2010. The polysilicon is deposited to a thickness adequate to ensure acceptable planarity over the gate bus trench 2028, for example 1 µm thick.

Figure 6C:
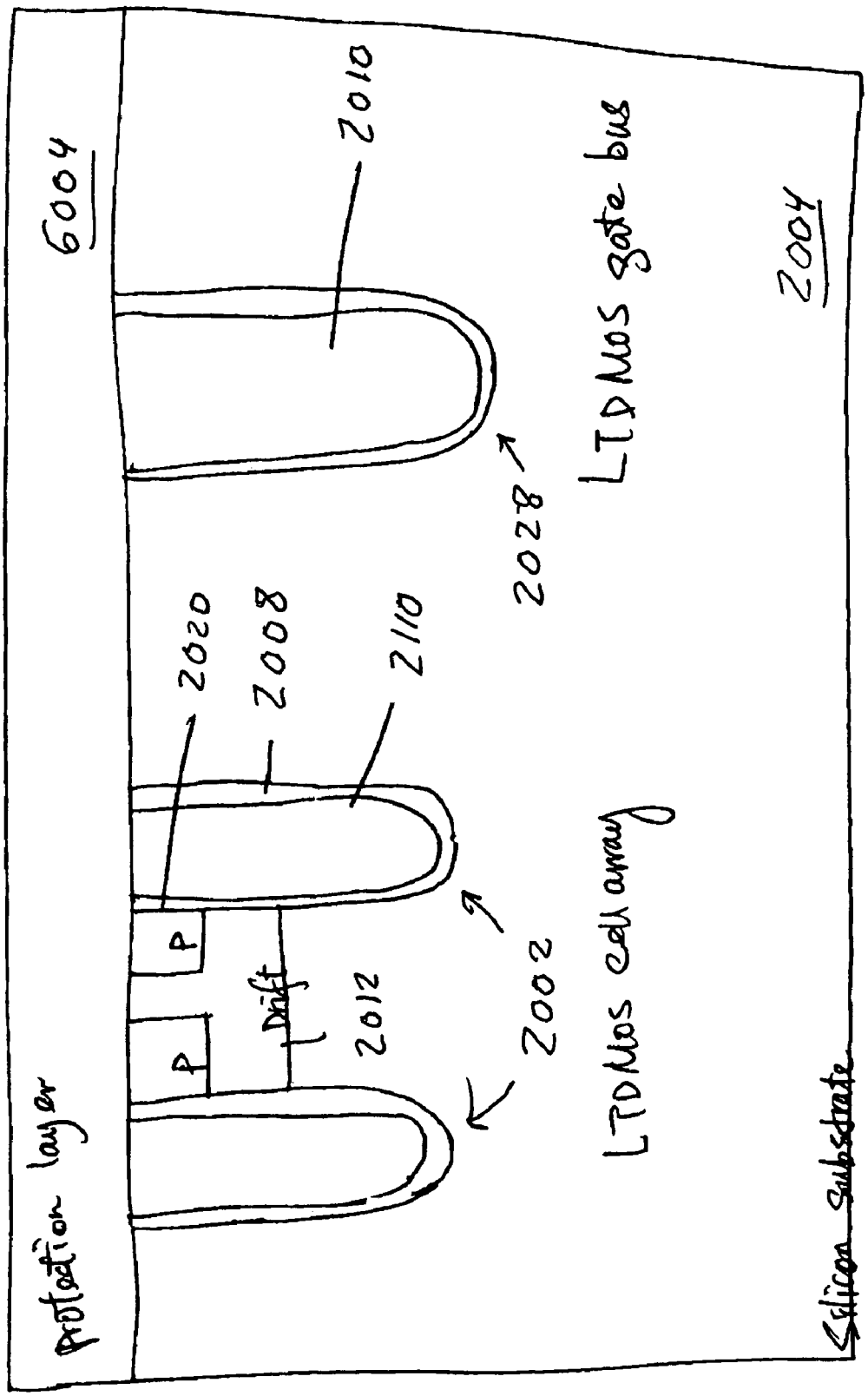

FIG. 6C shows the LTDMOS device 20 after the conductive gate material 2010 has been planarized, the N-drift region 2012 and P-body regions 2020 have been formed, and a protective layer 6004 has been formed on the surface of substrate 2004. Planarization of the trench gates 2002 and 2028 is achieved by etch-back, CMP, or other suitable processing. The planarization processing should be optimized to provide the proper alignment of the top of the trench poly with respect to the surface of substrate 2004. After planarization, the drift region 2012 and body region 2020 are formed, preferably by high-energy implantation of dopants into substrate 2004. The doping concentration and depth of drift region 2012 are chosen to optimize the trade-off between off-state BV and on-state resistance for a given LTDMOS application.

In this example, the dose of the implant used to form the drift region 2012 is about $3E12$ $cm^{-2}$ and the depth of drift region 2012 is about 1 µm. The doping concentration and depth of body regions 2020 are chosen to prevent punch-through during off-state operation and to provide the appropriate threshold voltage. In this example, the dose of the implant used to form body regions 2020 is about $5E12$ $cm^{-2}$ and the depth of body regions 2020 is about 0.5 µm. Before or after the formation of the drift region 2012 and body regions 2020, protective layer 6004 is formed on the surface to protect the gate dielectric layer 2008 and conductive gate material 2010 from damage during subsequent processing of other devices being formed in substrate 2004. The material and thickness of protective layer 6004 are chosen to provide adequate protection, depending on the processing steps to which it will be subjected. For example, a layer of deposited silicon dioxide with a thickness in the range of 1000-5000 Å may be used for protective layer 6004.

Figure 6D:
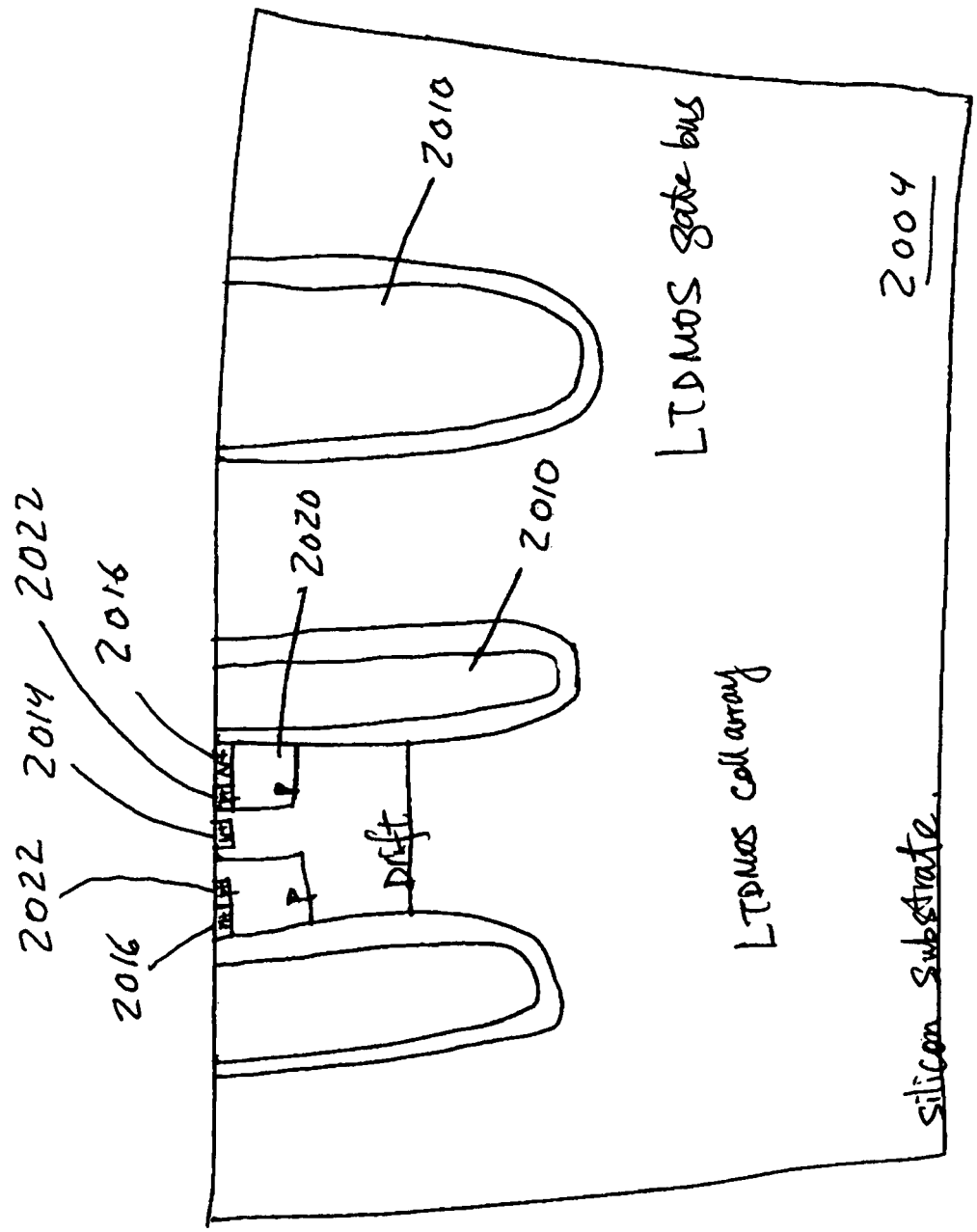
Figure 66:
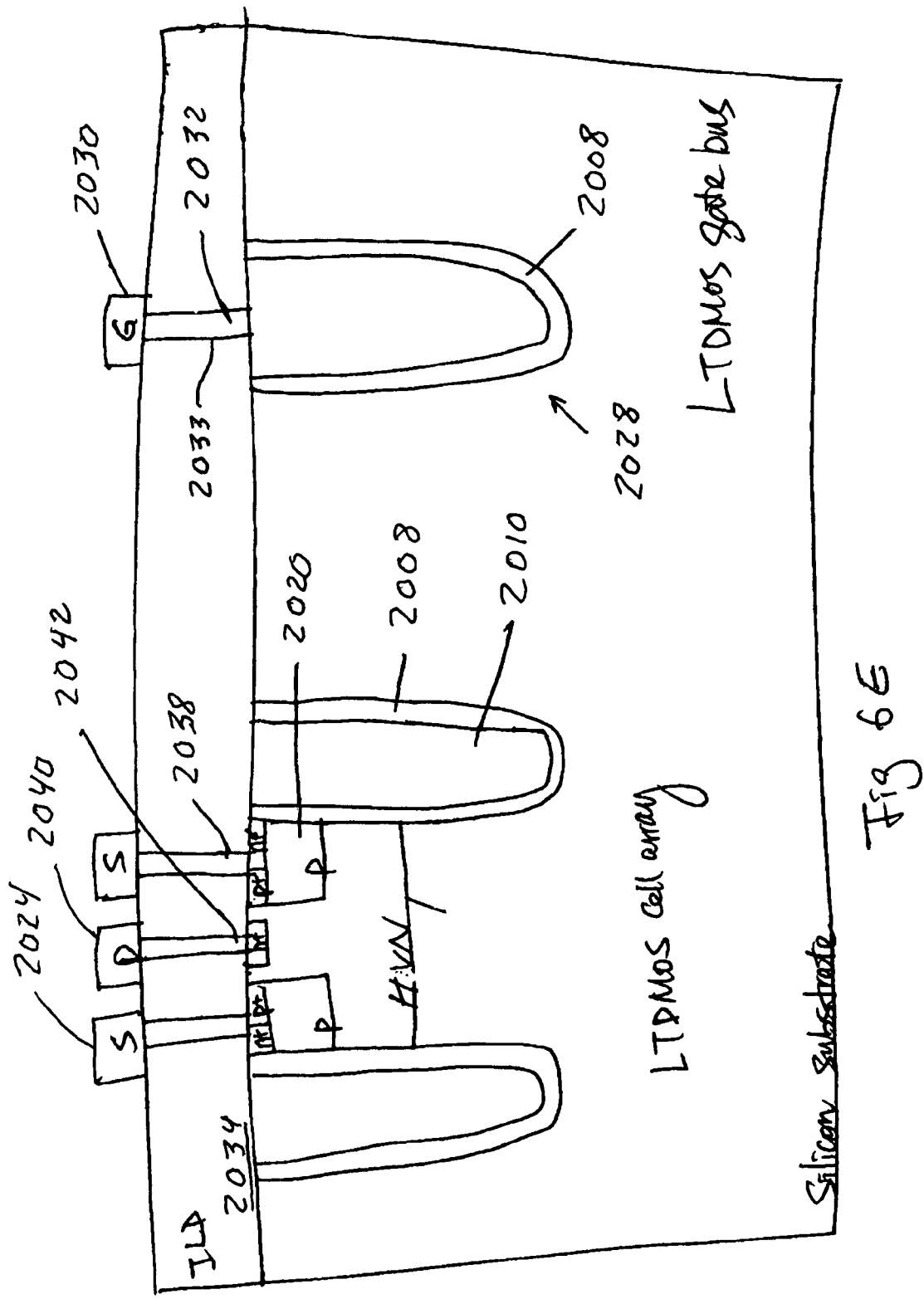

FIG. 6D shows the LTDMOS device 20 after the removal of the protective layer 6004 and the formation of the N+ source contact regions 2016 and drain contact region 2014 and the P+ body contact regions 2022 by implanting dopants into substrate 2004. In this example, the protective layer 6004 is removed prior to the formation of the N+ source contact regions 2016 and drain contact region 2014 and the P+ body contact regions 2022 so that these process steps may be shared by the LTDMOS 20 and other devices being formed in substrate 2004. In general, the removal of the protective layer 6004 should be done after processing which could potentially damage the gate dielectric layer 2008 and/or the conductive gate material 2010.

FIG. 6E shows the LTDMOS 20 after formation of ILD layer 2034, the opening of contact holes in ILD layer 2034, the filling of the contact holes with source contact plugs 2038, drain contact plug 2042 and gate contact plug 2032, and the deposition and patterning of source metallization layer 2024, drain metallization layer 2040 and gate metallization layer 2030. As shown, the walls of the contact hole 2033 that holds the gate contact plug 2032 are substantially vertical and intersect the conductive gate material 2010 in gate bus trench 2028. The ILD layer 2034 in this example is deposited silicon dioxide about 1.5 um thick, but other suitable dielectric layers or thicknesses may be used. Contact masking and etching are done as in conventional IC processing. Preferably, an anisotropic etching process is used to ensure that the walls of hole 2033 are substantially vertical. The contact etch is optimized to provide adequate contact to the gate bus trench 2028 in addition to the source contact regions 2016 and the drain contact region 2014 of the LTDMOS 20 and the contact regions in other monolithically integrated devices in substrate 2004.

A contact plug process is preferably used to fill the contact holes. For example, a tungsten layer may be deposited by chemical vapor deposition (CVD) and subsequently planarized by etchback and/or CMP processing. The formation of a contact hole with substantially vertical sidewalls and use of a contact plug process minimizes the required width of the gate bus trench 2028. For example, contact holes that are 0.4 µm square may be etched into an ILD layer that is 1.5 µm thick, and these contact holes may be successfully filled with CVD tungsten contact plugs. Moreover, the use of contact plugs makes the LTDMOS process compatible with standard CMOS processing that is employed to fabricate monolithically integrated devices on the same substrate. Alternative contact plug processes may also be used, such as selective tungsten deposition, which forms tungsten only on the exposed silicon regions of the contact holes and thus obviates the etchback process.

In another embodiment of this invention, the gate metallization layer may be used to contact the conductive material in the gate bus trench 2028 directly, without contact plugs. However, the contact holes will generally be much larger than they would be using a contact plug process, thus requiring a wider gate bus trench, which complicates the trench etching and refill processes, as noted above.

The source, drain, and gate metallization layers 2024, 2040, and 2030 comprise a first metallization layer that is deposited and patterned by conventional IC processing. In this example, a 6000 Å thick layer of aluminum or an aluminum alloy is deposited, masked by photoresist, and etched to form separate electrodes. Although not shown here, additional processing steps may also be included, such as formation of additional metallization layers, ILD layers, and passivation layers.

FIGS. 7A-7E show cross-sectional views after key steps in a second manufacturing method for an LTDMOS in accordance with this invention. Each of FIGS. 7A-7E includes a cross-sectional view of an LTDMOS cell array 700, an LTDMOS gate bus area 702, and an area 704 containing integrated devices that are isolated from each other by a conventional shallow trench isolation (STI) and isolated from the LTDMOS by a deep trench isolation (DTI). As described below, both STI and DTI may share processing steps in common with the LTDMOS.

Figure 7A:
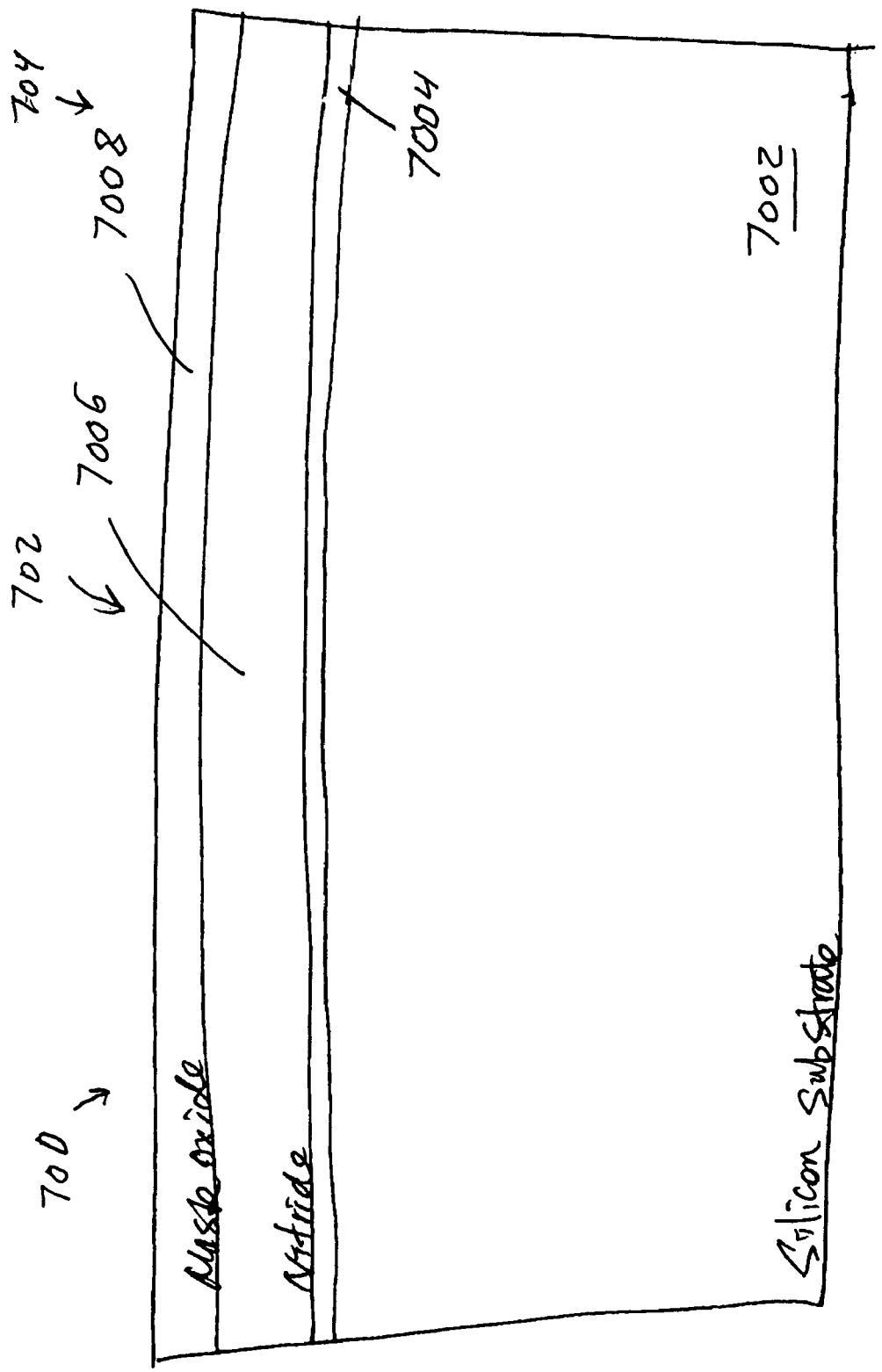

FIG. 7A shows a cross-sectional view after the deposition on a substrate 7002 of mask layers to be used during the silicon trench etch and subsequent processing. In this example, these layers comprise a thermally grown pad oxide layer 7004, a deposited nitride layer 7006, and a deposited mask oxide layer 7008. However, other suitable materials may be substituted.

FIG. 7B shows a cross-sectional view after masking and etching to form LTDMOS gate trenches 7010, a gate bus trench 7012 and a deep isolation trench 7014 in the silicon substrate 7002. The depth of LTDMOS trenches 7010 is determined by the requirements of the LTDMOS device. In this example, the depth of trenches 7010 is about 1.5 μm. The width of trenches 7010 is preferably the minimum allowed by the process, in order to increase the trench density for better on-state performance, while spacing between trenches 7010 is governed primarily by the off-state (BV) requirements of the device. In this example, the width of trenches 7010 is about 0.5 μm and the spacing between trenches 7010 is about 5 μm. The gate bus trench 7012 is substantially wider than the trenches 7010 in the LTDMOS cell array, and is preferably the minimum width required for contact by the standard contact plug employed in the process. In this example, the width of gate bus trench 7012 is about 1 μm.

FIG. 7C shows a cross-sectional view after formation of a gate dielectric layer 7016 and conductive gate layer 7018. The gate dielectric layer 7016 in this example is thermally grown silicon dioxide, but other suitable gate materials may also be used. The thickness of the gate dielectric layer 7016 is chosen to support the required gate voltage and provide the desired threshold voltage. In this example, gate dielectric layer 7016 is about 200 Å thick. The conductive gate layer 7018 in this example is in-situ doped polysilicon, but other suitable gate materials may also be used. The polysilicon in conductive gate layer 7018 is heavily doped to provide low resistance. The deposited thickness of conductive gate layer 7018 is sufficient for acceptable planarity over the gate bus trench 7012, for example about 1 μm thick.

FIG. 7D shows a cross-sectional view after the conductive gate layer 7018 has been planarized. Planarization is achieved by etch-back, CMP, or other suitable processing. In this example, the top of the etched-back conductive gate layer 7018 is within an opening in the nitride layer 7006 in order to protect trench gate bus trench 7012 from damage during the removal of mask oxide layer 7008. In another embodiments, a CMP process that stops on the nitride layer 7006 may be employed.

Figure 7E:
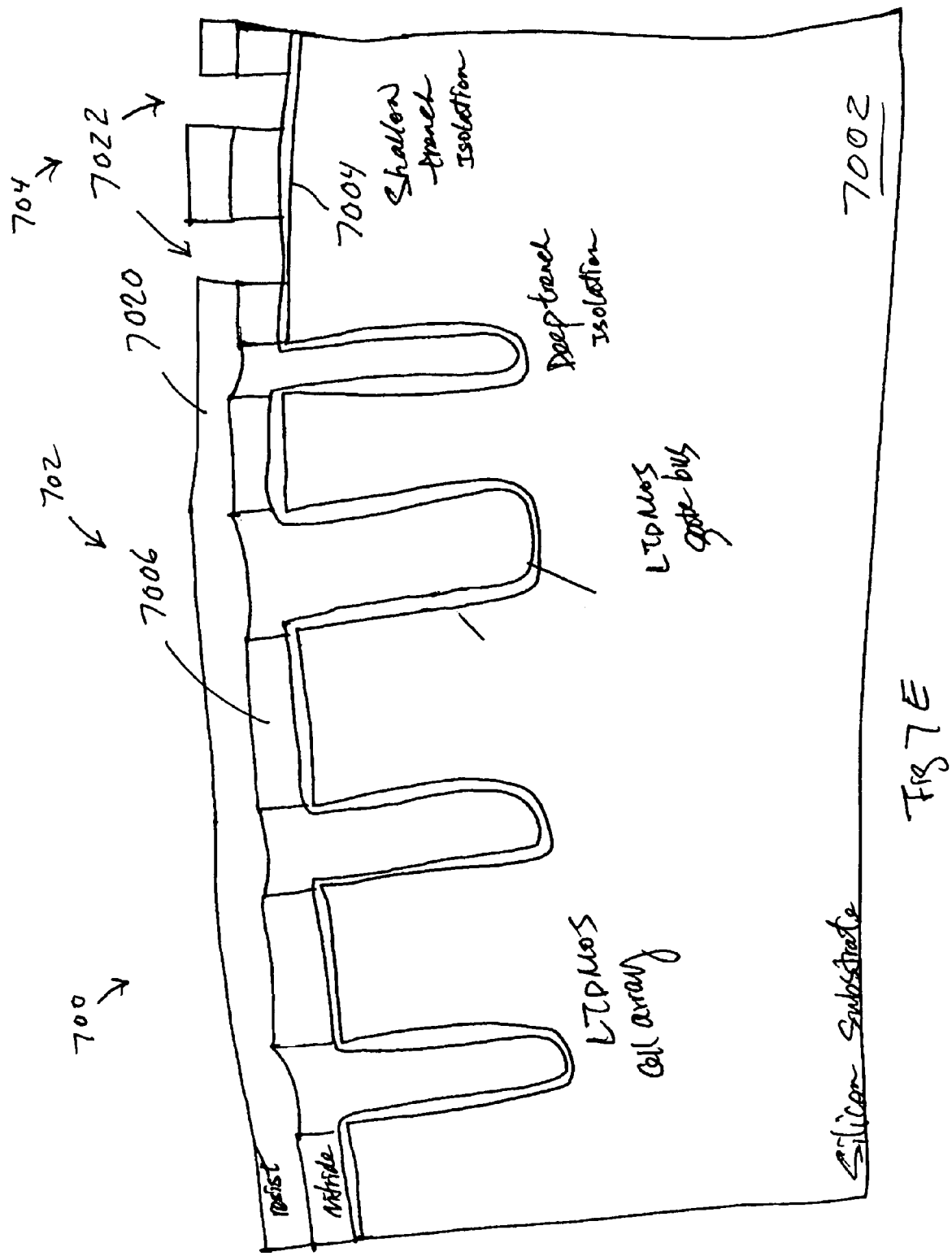
Figure 76:
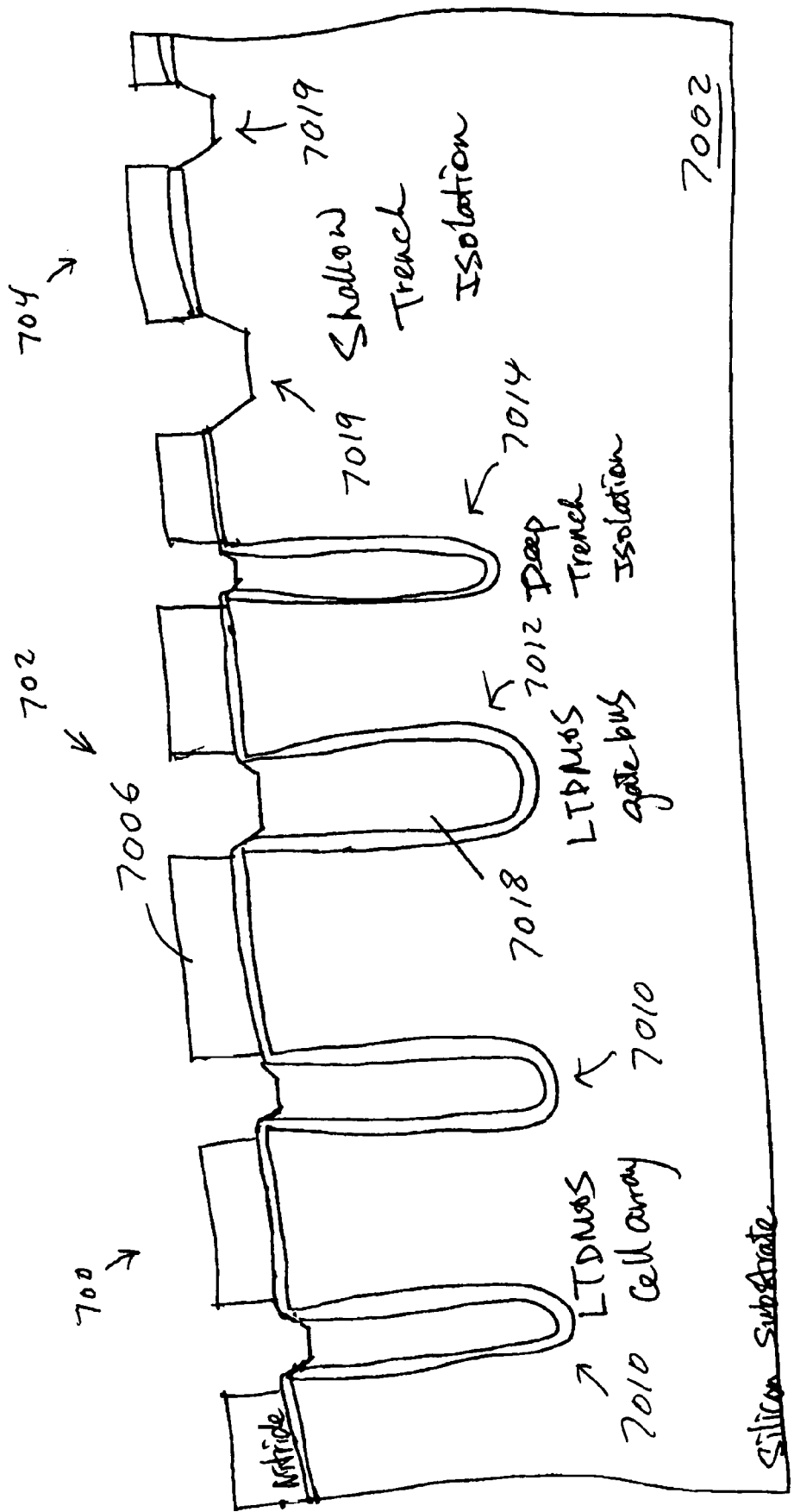

FIG. 7E shows a cross-sectional view after STI mask layer 7020 has been deposited. The STI areas 7022 have been patterned and the masking layers have been etched to expose the surface of pad oxide layer 7004. FIG. 7F shows a cross-sectional view after the STI mask layer 7020 has been removed. The conductive gate layer 7018 in the LTDMOS and DTI areas are exposed such that the STI etch process can simultaneously etch into the conductive gate layer 7018 in the LTDMOS gate trenches 7010, the gate bus trench 7012 and the deep isolation trench 7014.

FIG. 7G shows a cross-sectional view after the STI etch. STI trenches 7019 have been formed in the substrate 7002 and gate layer 7018 has been recessed using etch the same STI etch process, without any additional mask.

Figure 7H:
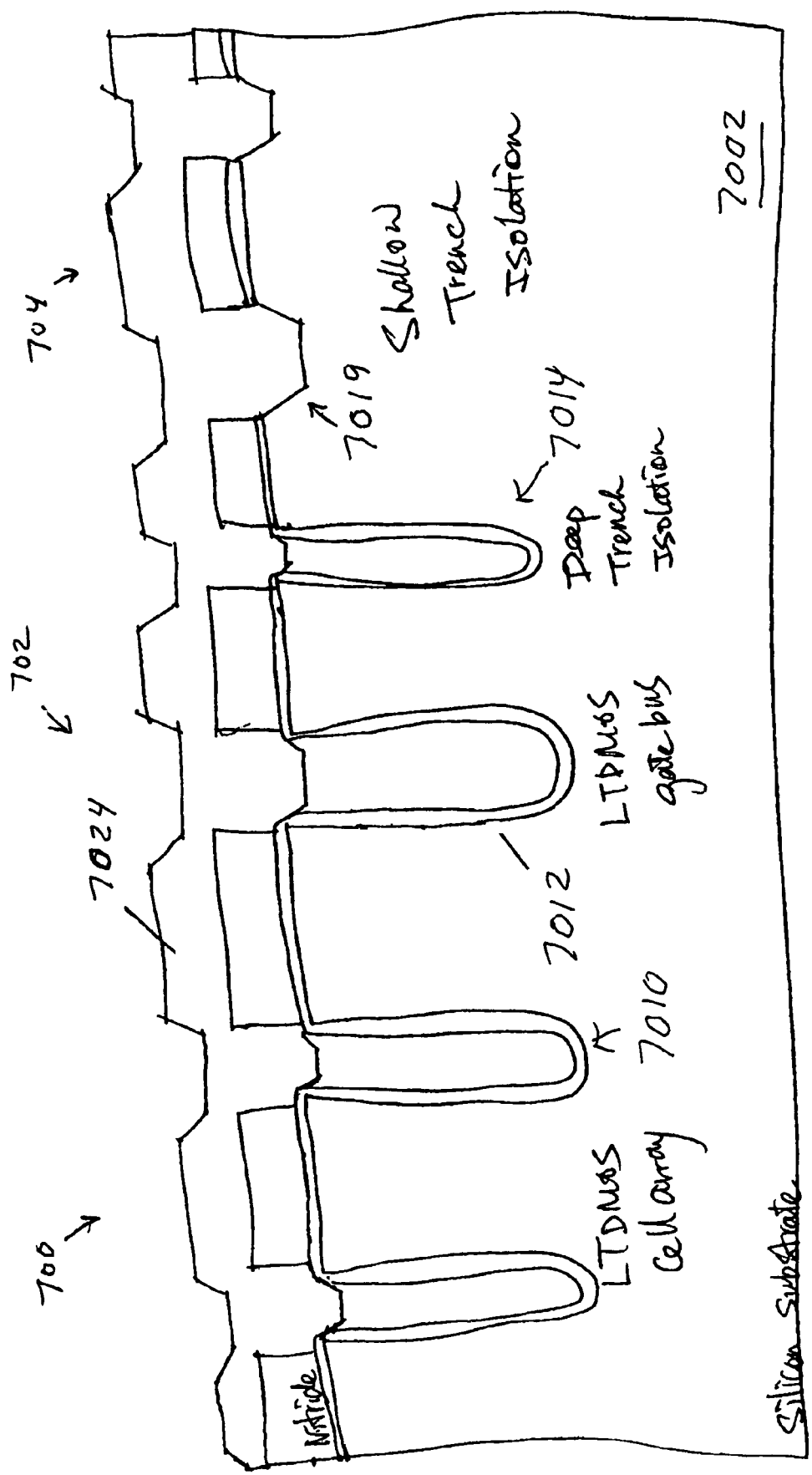
Figure 71:
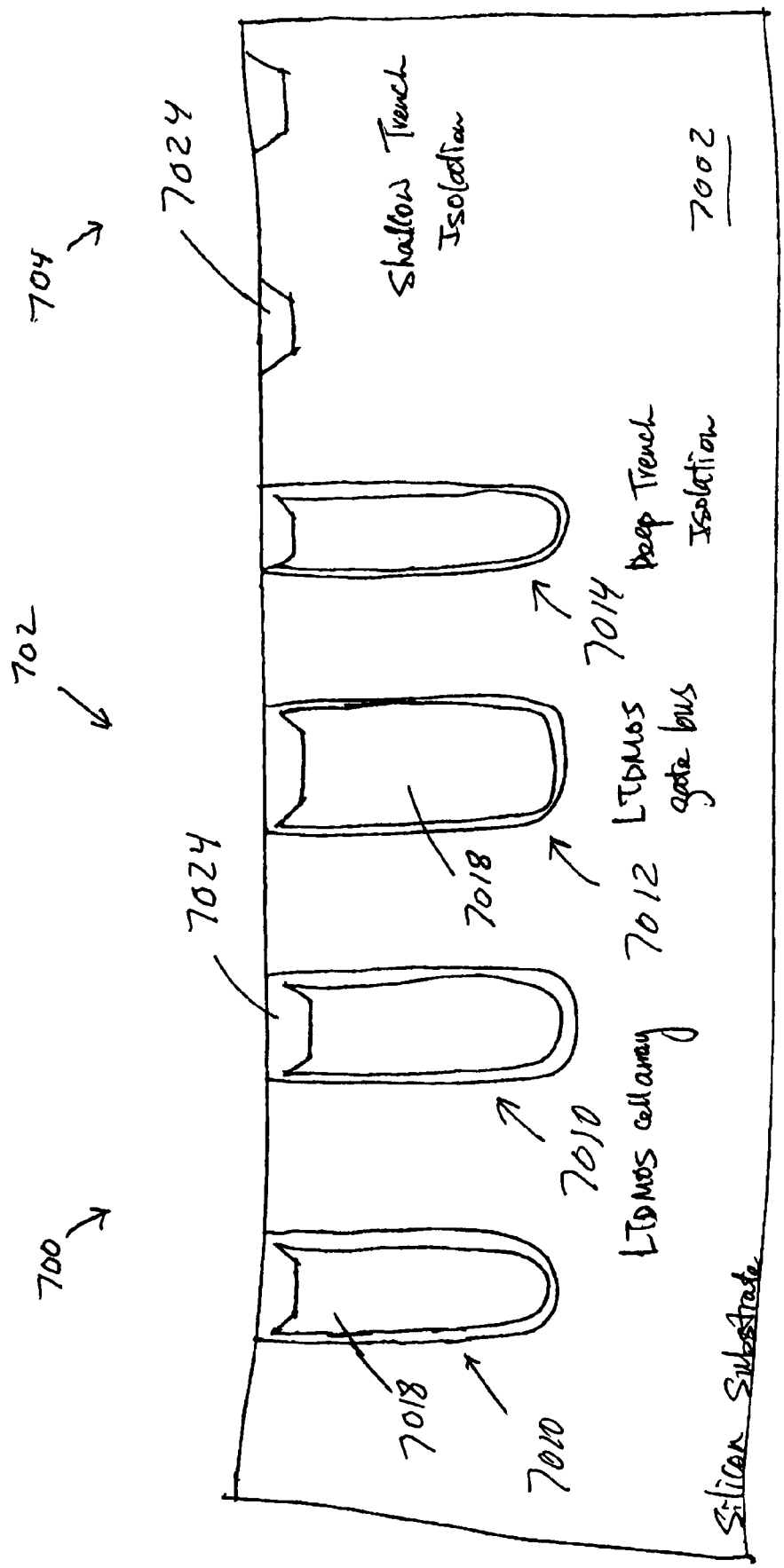

FIG. 7H shows a cross-sectional view after the formation of an STI dielectric layer 7024. In this example, a STI dielectric layer 7024 includes a thermal oxide layer and a deposited oxide layer. After STI dielectric layer 7024 has been formed, the conductive gate layer 7018 within gate bus trench 7012 and LTDMOS gate trenches 7010 is embedded below the surface of substrate 7002 and is protected by the STI dielectric layer 7024 from damage during subsequent processing of other devices being formed in substrate 7002.

FIG. 7I shows a cross-sectional view after the planarization of STI dielectric layer 7024, which may be carried out according to conventional IC processing techniques. In this example, CMP processing is used, but other suitable processes may be substituted. Conductive gate layer 7018 in the LTDMOS cell array 700 and the LTDMOS gate bus area 702 is protected, because the top surface of the conductive gate layer 7018 is depressed with respect to the surface of substrate 7002 and gate layer 7018 is covered by STI dielectric layer 7024. Since the surfaces of substrate 7002 and STI dielectric layer 7024 in the LTDMOS cell array 700 and the LTDMOS gate bus area 702 are fully planarized, this device can be easily integrated monolithically with other devices. Poly filled trenches may also be used to provide deep trench isolation between the LTDMOS and other devices, and among the other devices.

FIG. 7J shows a cross-sectional view after formation of an N-drift region 7026 and a P-body region 7028 in the LTDMOS cell array 700, and optional formation of well diffusion regions 7030 in other device areas. The drift region 7026 and body region 7028 may be formed by high-energy implantation and a short thermal activation step. The doping concentration and depth of drift region 7026 are chosen to optimize the trade-off between off-state BV and on-state resistance for a given LTDMOS application. In this example, the dose of the implant used to form the drift region 7026 is about $3E12\ cm^{-2}$ and the depth of drift region 7026 is about 1 μm. The doping concentration and depth of the body region 7028 are chosen to prevent punch-through during off-state operation and to provide the appropriate threshold voltage. In this example, the dose of the implant used to form body region 7028 is about $5E12\ cm^{-2}$ and the depth of body region 7028 is about 0.5 μm.

FIG. 7K shows a cross-sectional view after formation of an ILD layer 7032, opening of contact holes, filling of contact holes with contact plugs, and deposition and patterning a metallization layer. The ILD layer 7032 in this example is deposited silicon dioxide about 1.5 μm thick, but other suitable dielectric layers or thicknesses may be used. Contact masking and etching are done as in conventional IC processing. The contact etch is optimized to provide adequate contact to the conductive gate layer 7018 in gate bus trench 7012 and the contact regions in the LTDMOS cell array 700 and other monolithically integrated devices in substrate 7002. A conventional contact plug process is used to fill the contact holes. In this example, a tungsten layer is deposited and planarized by etchback and/or CMP processing. The use of a contact plug process minimizes the required width of the gate bus trench 7012 and makes the LTDMOS process compatible with standard CMOS processing that is generally employed for the monolithically integrated devices. In other embodiments, the gate metallization layer may contact the conductive material 7018 in the gate bus trench 7012 directly. A first metallization layer is deposited and patterned by conventional IC processing. In this example, a 6000 Å thick layer of aluminum is deposited, masked by photoresist, and etched to form separate electrodes. Although not shown here, additional processing steps may also be included, such as formation of additional metallization layers, ILD layers, and passivation layers.

In addition to the LTDMOS cell array 700, FIG. 7K shows a bipolar transistor 7034 that is isolated by deep isolation trench 7014, which is formed at the same time as the LTDMOS gate trenches 7010 and gate bus trench 7012. Also shown is a CMOS device 7036 in between the STI trenches 7019.

The foregoing embodiments are illustrative only and should not be interpreted as limiting the broad scope of this invention. Many alternative embodiments of this invention will be apparent to persons of skill in the art.

We claim:

1. A lateral trench MOSFET comprising:
   a semiconductor substrate;
   a trench formed in the substrate, the trench being lined with a first dielectric layer and containing a conductive material, the first dielectric layer electrically insulating the conductive material from the substrate, the trench comprising an LTDMOS segment and a gate bus segment;
   a body region of a first conductivity type abutting a sidewall of the LTDMOS segment of the trench;
   a source region of second conductivity type positioned at a top surface of the substrate and adjoining the body region;
   a drift region of the second conductivity type adjoining the body region and the sidewall of the LTDMOS segment of the trench;
   a drain region of the second conductivity type adjoining the drift region and being positioned at the surface of the substrate at a location laterally spaced apart from the source region;
   a second dielectric layer disposed above a top surface of the substrate, a contact hole being formed in the second dielectric layer over the gate bus segment of the trench; and
   a gate metal layer above the second dielectric layer, the gate metal layer being in electrical contact with the conductive material in the gate bus segment of the trench via the contact hole.

2. The lateral trench MOSFET of claim 1 wherein a lateral dimension of the contact hole is located entirely over the gate bus segment of the trench.

3. The lateral trench MOSFET of claim 1 wherein the contact hole has substantially vertical sidewalls extending from a top surface of the second dielectric layer to the surface of the substrate.

4. The lateral trench MOSFET of claim 1 wherein the gate bus segment of the trench is wider than the LTDMOS segment of the trench.

5. The lateral trench MOSFET of claim 1 wherein a top surface of the conductive material in the trench is depressed with respect to the top surface of the substrate.

6. The lateral trench MOSFET of claim 5 comprising a third dielectric layer, the third dielectric layer being located in the trench between the top surface of the conductive material and the second dielectric layer.

7. A trench semiconductor device comprising:
   a semiconductor substrate;
   a trench formed in the substrate, the trench being lined with a first dielectric layer and containing a conductive material, the first dielectric layer electrically insulating the conductive material from the substrate, the trench comprising an device segment and a gate bus segment;
   a second dielectric layer disposed above a top surface of the substrate, a contact hole being formed in the second dielectric layer over the gate bus segment of the trench, the contact hole having substantially vertical sidewalls, the sidewalls intersecting the conductive material in the gate bus segment of the trench;
   a gate metal layer disposed above the second dielectric layer, the gate metal layer comprising a first metal; and
   a conductive contact plug disposed in the contact hole, the contact plug providing electrical contact between the gate metal layer and the conductive material in the gate bus segment of the trench, the contact plug comprising a second metal different from the first metal.

8. The trench semiconductor device of claim 7 wherein a lateral dimension of the contact plug is located entirely over the gate bus segment of the trench.

9. The trench semiconductor device of claim 7 wherein the gate bus segment of the trench is wider than the device segment of the trench.

10. The trench semiconductor device of claim 7 wherein the trench is linear.

11. The trench semiconductor device of claim 7 wherein the trench is in the form of a closed loop.

12. The trench semiconductor device of claim 7 wherein a top surface of the conductive material in the trench is depressed with respect to the top surface of the substrate.

13. The trench semiconductor device of claim 7 wherein the first metal comprises aluminum or an aluminum alloy.

14. The trench semiconductor device of claim 7 comprising a lateral trench MOSFET adjacent the device segment of the trench.

15. The trench semiconductor device of claim 8 wherein the linear trench comprises a plurality of gate bus segments disposed at regular intervals along the trench.

16. The trench semiconductor device of claim 12 comprising a third dielectric layer, the third dielectric layer being located in the trench between the top surface of the conductive material and the second dielectric layer.

17. The trench semiconductor device of claim 13 wherein the second metal comprises tungsten or a tungsten alloy.

18. The trench semiconductor device of claim 15 wherein a gate bus segment is located at each end of the trench.

19. A semiconductor arrangement comprising:
   a semiconductor substrate;
   a trench formed in the substrate, the trench being lined with a first dielectric layer and containing a conductive material, the first dielectric layer electrically insulating the conductive material from the substrate, the trench comprising an device segment and a gate bus segment, a top surface of the conductive material in the trench being depressed with respect to the top surface of the substrate;

a first semiconductor device located adjacent the device segment of the trench;

a second dielectric layer disposed above a top surface of the substrate, a contact hole being formed in the second dielectric layer over the gate bus segment of the trench, the contact hole having substantially vertical sidewalls, the sidewalls intersecting the conductive material in the gate bus segment of the trench;

a gate metal layer above the second dielectric layer, the gate metal layer being in electrical contact with the conductive material in the gate bus segment of the trench via the contact hole;

a third dielectric layer, the third dielectric layer being located in the trench between the top surface of the conductive material and the second dielectric layer;

a shallow isolation trench formed in the substrate, the shallow isolation trench containing the third dielectric layer.

20. The semiconductor arrangement of claim 19 comprising a second semiconductor device adjacent the shallow isolation trench.

21. The semiconductor arrangement of claim 20 wherein the first device comprises a lateral trench MOSFET.

22. The semiconductor arrangement of claim 21 wherein the second device comprises a portion of a CMOS device.

* * * * *